US011928988B2

(12) United States Patent
Tsukamoto et al.

(10) Patent No.: US 11,928,988 B2
(45) Date of Patent: Mar. 12, 2024

(54) DISPLAY DEVICE AND MANUFACTURING METHOD THEREOF

(71) Applicant: SEMICONDUCTOR ENERGY LABORATORY CO., LTD., Atsugi (JP)

(72) Inventors: Yosuke Tsukamoto, Kanagawa (JP); Daiki Nakamura, Kanagawa (JP); Daisuke Furumatsu, Kanagawa (JP); Kazuhiko Fujita, Kanagawa (JP); Kyoichi Mukao, Kanagawa (JP); Junya Maruyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/830,377

(22) Filed: Jun. 2, 2022

(65) Prior Publication Data

US 2022/0301461 A1    Sep. 22, 2022

Related U.S. Application Data

(63) Continuation of application No. 16/485,920, filed as application No. PCT/IB2018/051085 on Feb. 22, 2018, now Pat. No. 11,380,218.

(30) Foreign Application Priority Data

Mar. 3, 2017   (JP) ................... 2017-040221
Apr. 4, 2017   (JP) ................... 2017-074386

(51) Int. Cl.
*H10K 50/00*   (2023.01)
*G09F 9/30*   (2006.01)
(Continued)

(52) U.S. Cl.
CPC ............ *G09F 9/30* (2013.01); *G09F 9/40* (2013.01); *H05B 33/06* (2013.01); *H10K 50/00* (2023.02)

(58) Field of Classification Search
CPC ...... H01L 25/167; H01L 27/153; H01L 27/32; H01L 27/3202; H01L 27/3204;
(Continued)

(56) References Cited

U.S. PATENT DOCUMENTS 7,335,573 B2   2/2008   Takayama et al.
8,305,294 B2   11/2012  Cok et al.
(Continued)

FOREIGN PATENT DOCUMENTS

CN   102820004 A   12/2012
CN   106663396 A   5/2017
(Continued)

OTHER PUBLICATIONS

International Search Report (Application No. PCT/IB2018/051085) dated May 1, 2018.
(Continued)

*Primary Examiner* — Moin M Rahman
(74) *Attorney, Agent, or Firm* — NIXON PEABODY LLP; Jeffrey L. Costellia

(57) ABSTRACT

A plurality of display panels having a curved surface are placed in a limited space.
Two, or three or more display panels are combined to form one display region having a T-shaped outer edge as one screen, and a driver can curve part of the display panel as appropriate so that the driver can see the screen easily. A first display panel or a second display panel has flexibility and includes a position adjustment function of curving an end
(Continued)

portion. That is, by curving part of the display panel, the user can see the display panel easily. The in-car design can also be varied.

15 Claims, 15 Drawing Sheets

(51) Int. Cl.
*G09F 9/40* (2006.01)
*H05B 33/06* (2006.01)

(58) Field of Classification Search
CPC .......... H01L 27/3209; H01L 27/32225; H01L 27/3251; H01L 27/3258; H01L 51/50; H01L 51/525; H01L 51/5287; H01L 2227/32; H01L 2227/326; H01L 2251/5323; H01L 2251/5338; H01L 2251/5353; H01L 2251/56; H01L 2251/566; H01L 27/3267; H01L 27/3248; H01L 27/3246; H01L 27/3262; H01L 51/5012; H01L 27/3211; H01L 51/5281; H01L 51/5234; H01L 51/5206; H01L 51/5209; H01L 27/3244; H01L 51/0097; H10K 50/00–88; H10K 59/00–95; H10K 65/00; H10K 71/00–861; H10K 85/00–791; H10K 2101/00–90; H10K 2102/00–361; H10K 50/11; H10K 50/15; H10K 50/16; H10K 50/171; H10K 2101/30; H10K 2101/40; H10K 2102/351; H10K 50/852; H10K 59/35; H10K 59/12; H10K 50/156; H10K 85/615; H10K 85/624; H10K 85/626; H10K 85/631; H10K 85/633; H10K 85/636; H10K 85/6572; H10K 50/155; H10K 50/115; H10K 50/13; H10K 50/80; H10K 85/6574; H10K 2102/10; H10K 2102/101; H10K 2102/102; H10K 2102/103; H10K 2102/20; H10K 2102/301; H10K 2102/302; H10K 2102/3023; H10K 2102/3026; H10K 2102/3031; H10K 2102/3035; H10K 2102/311; H10K 2102/321; H10K 2102/331; H10K 2102/341; B60K 37/02; B60K 2370/1523; B60K 2370/331; B60K 2370/52; B60R 1/00
See application file for complete search history.

(56) References Cited

U.S. PATENT DOCUMENTS

| | | |
|---|---|---|
| 9,493,119 B2 | 11/2016 | Takayama et al. |
| 9,614,022 B2 | 4/2017 | Miyake et al. |
| 9,854,629 B2 | 12/2017 | Ikeda et al. |
| 10,325,940 B2 | 6/2019 | Takayama et al. |
| 10,359,810 B2 | 7/2019 | Miyake et al. |
| 2008/0049437 A1 | 2/2008 | Takayama et al. |
| 2010/0188422 A1 | 7/2010 | Shingai et al. |
| 2012/0313862 A1 | 12/2012 | Ko et al. |
| 2014/0253419 A1 | 9/2014 | Tanada |
| 2015/0228704 A1 | 8/2015 | Miyake et al. |
| 2016/0019019 A1* | 1/2016 | Ikeda ................ G06F 3/1446 345/1.3 |
| 2016/0037608 A1* | 2/2016 | Ikeda ................ H10K 59/18 362/235 |
| 2016/0044751 A1 | 2/2016 | Ikeda et al. |
| 2016/0103649 A1 | 4/2016 | Yoshitani et al. |

FOREIGN PATENT DOCUMENTS

| | | | |
|---|---|---|---|
| EP | 2533233 A | | 12/2012 |
| JP | 2002-014366 A | | 1/2002 |
| JP | 2003-229548 A | | 8/2003 |
| JP | 2004-251981 A | | 9/2004 |
| JP | 2010-107551 A | * | 5/2010 |
| JP | 2010-107551 A | | 5/2010 |
| JP | 2012-028638 A | | 2/2012 |
| JP | 2012-256019 A | | 12/2012 |
| JP | 2013-504092 | | 2/2013 |
| JP | 2014-197179 A | | 10/2014 |
| JP | 2015-180924 A | | 10/2015 |
| JP | 2016-038579 A | | 3/2016 |
| KR | 2012-0136226 A | | 12/2012 |
| TW | 201610948 | | 3/2016 |
| WO | WO-2009/050812 | | 4/2009 |
| WO | WO-2011/031605 | | 3/2011 |
| WO | WO-2016/020845 | | 2/2016 |

OTHER PUBLICATIONS

Written Opinion (Application No. PCT/IB2018/051085) dated May 1, 2018.

* cited by examiner

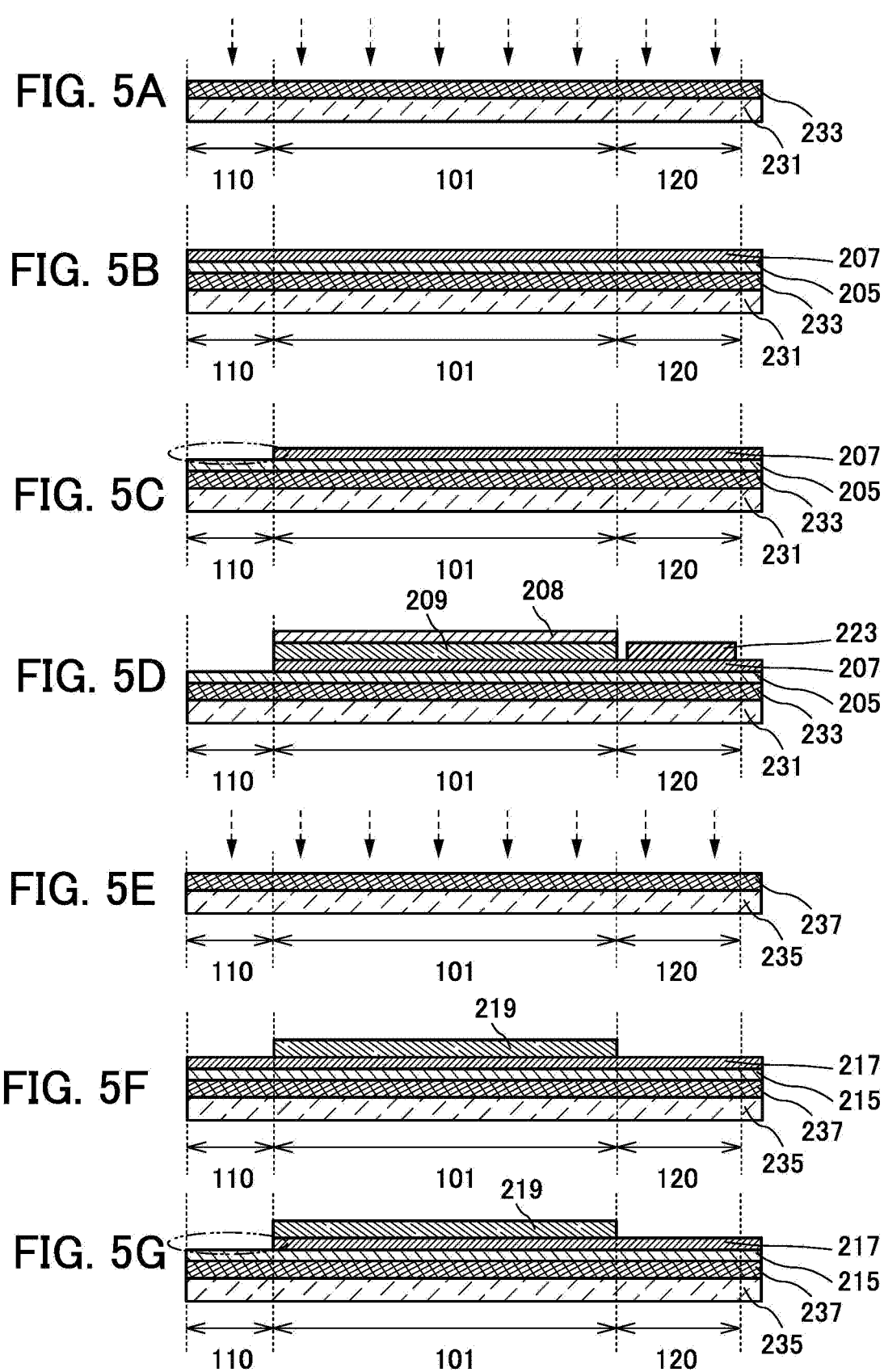

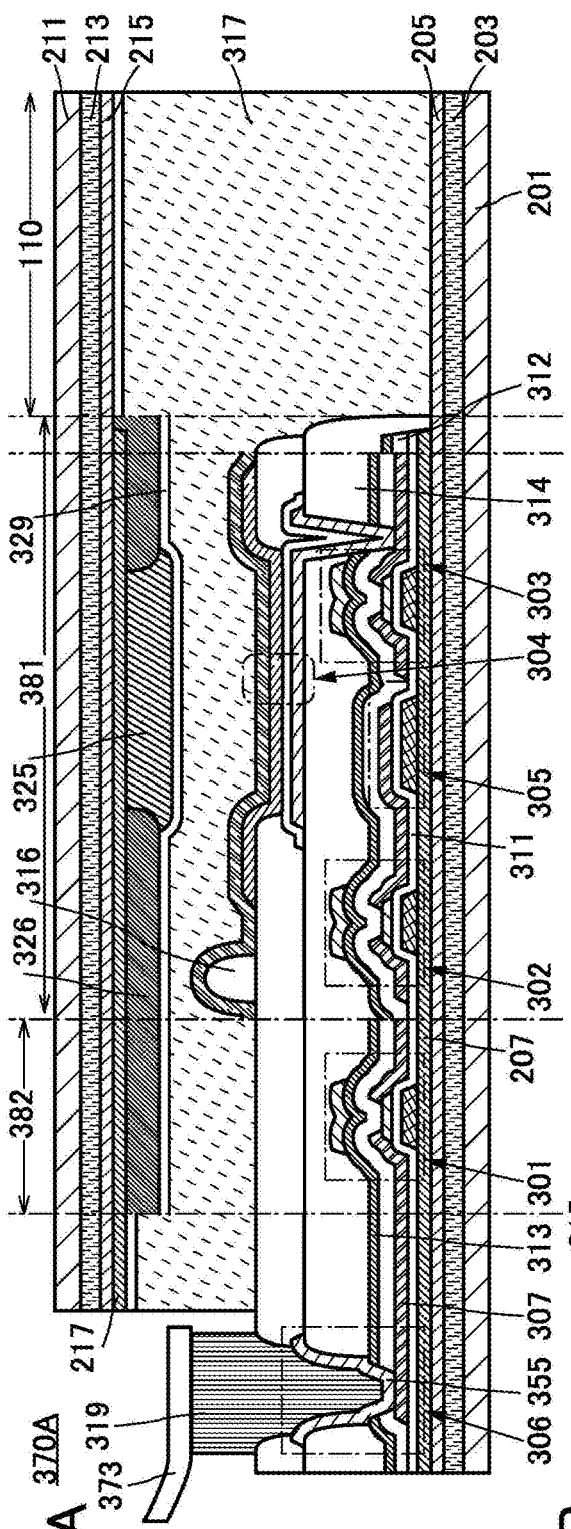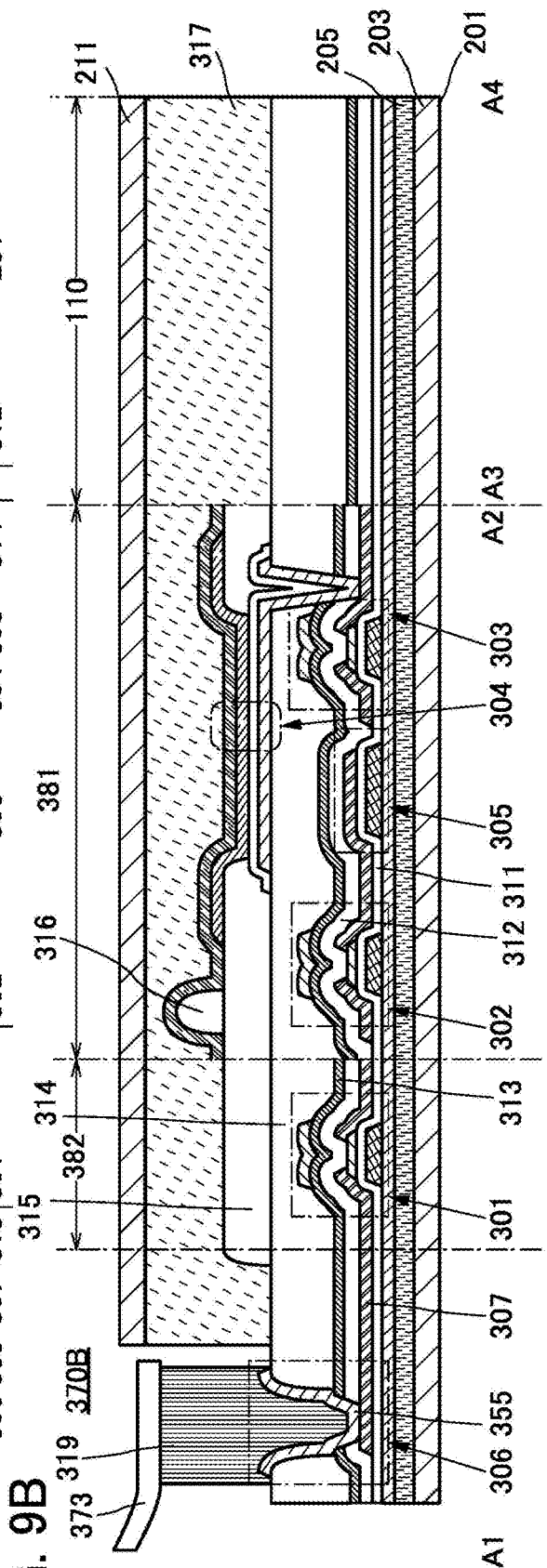

DISPLAY DEVICE AND MANUFACTURING METHOD THEREOF

TECHNICAL FIELD

The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting device, a lighting device, a power storage device, a memory device, a driving method thereof, and a manufacturing method thereof. Note that one embodiment of the present invention is not limited to the above technical field.

Note that in this specification, a semiconductor device refers to all devices which can function by utilizing semiconductor characteristics, and electro-optical devices, semiconductor circuits, and electronic devices are all semiconductor devices.

BACKGROUND ART

Development is advanced so that an instrument displaying a car or the like is partly replaced with a liquid crystal display device. Display in a car has been utilized and approaches to supporting a driver of a vehicle such as a car have been taken to use more information (e.g., information on the situation around the car, traffic information, and geographic information).

A number of cameras and sensors will be installed inside and outside a car in the future.

A display panel having a curved surface is disclosed in Patent Document 1. A structure in which a plurality of display panels overlap with one another is disclosed in Patent Document 2. A display device having a non-rectangular display region is disclosed in Patent Document 3.

REFERENCE

Patent Document

[Patent Document 1] Japanese Published Patent Application No. 2003-229548
[Patent Document 2] Japanese Published Patent Application No. 2014-197179
[Patent Document 3] Japanese Published Patent Application No. 2015-180924

SUMMARY OF THE INVENTION

Problems to be Solved by the Invention

In order to perform display warning a driver of a risk depending on the situation obtained from a variety of cameras and sensors, the areas of display regions corresponding to the numbers of cameras and sensors are needed. However, the inside of a car is a limited space surrounded by windows or the like, and the place where a display portion can be installed inside a car has a variety of uneven surfaces including a curved surface.

When a display panel having a plane with a large display area and a large thickness is installed on a dashboard, a driver's field of vision is obstructed.

Means for Solving the Problems

A plurality of display panels having a curved surface are placed in a limited space. The plurality of display panels include a region where at least two display panels overlap with each other. At least one of the plurality of display panels has a curved surface, and the other display panels may have a flat surface.

Two, or three or more display panels are combined to form one display region having a T-shaped outer edge. Thus, two systems or three or more systems of video signals, which correspond to the number of combined display panels are used for one display region having a T-shape. When a driver considers that display of the entire screen is unnecessary, a period in which power supplied to one of the plurality of display panels that form one display region is set to zero is provided because each display region can be turned on or off as necessary, so that power consumption can also be reduced.

According to one embodiment of the present invention of a display device that includes a first display panel, a second display panel, and a third display panel, the first display panel includes a first region and a second region; the second display panel includes a third region and a fourth region; the third display panel includes a fifth region and a sixth region; the first region, the third region, and the fifth region each have a function of transmitting visible light; the second region, the fourth region, and the sixth region each have a function of performing display; a first portion in which the first region of the first display panel and the fourth region of the second display panel overlap with each other is included; a second portion in which the fifth region of the third display panel and the second region of the first display panel overlap with each other is included; a third portion in which the fifth region of the third display panel and the fourth region of the second display panel overlap with each other is included; and one display region including the second region, the fourth region, and the sixth region has a substantial T-shape.

It is preferable to fix a plurality of display panels to a curved surface of a car dashboard, or the like, and overlap end portions of the plurality of display panels to obtain one display region. Each display panel is desired to be thin so that a transmissive region in the periphery of a display region of one display panel and a display region of an adjacent display panel overlap with each other. Therefore, for the display panel, an active matrix display panel using an organic light-emitting element formed over a plastic film is suitable.

In the above structure, in order to overlap the end portions of the plurality of display panels, one feature is that a fourth portion in which the fifth region of the third display panel, the third region of the second display panel, and the first region of the first display panel overlap with one another is included and the fourth portion is placed between the second portion and the third portion.

In the case of overlapping the end portions of the plurality of display panels and displaying one video, a display seam might be caused when display of the entire screen is performed. It is preferable to combine two, or three or more display panels and adjust discontinuity of video at the seam between the display regions of the adjacent display panels so that a user does not recognize it easily. In particular, in the case where the display panels are high-resolution panels, for example, a plurality of display panels are combined from a 2K display panel in which the number of pixels is 1920× 1080, a 4K display panel in which the number of pixels is 3840×2160 or 4096×2160, and a 8K display panel in which the number of pixels is 7680×4320 or more, it is preferable to use artificial intelligence (AI) to adjust discontinuity of the video so that a user does not recognize it easily.

Against a problem of discontinuity of the video at the seam, a display system including a display device in which a plurality of display panels according to one embodiment of the present invention are combined is preferably provided with a correction circuit having a function of correcting a video signal with the use of artificial intelligence (AI). Specifically, learning by an artificial neural network (ANN) enables a correction circuit to correct a video signal so as to alleviate the discontinuity of the video particularly at the seam of the display region. Inference (recognition) is made by the artificial neural network after the learning, whereby a video signal is corrected to compensate for discontinuity of the video. This makes it possible to display what is called seamless video in which a seam is inconspicuous, so that the quality of high-resolution video can be improved.

Note that artificial intelligence refers to a computer that imitates the intelligence of human beings. An artificial neural network is a circuit that imitates a neural network composed of neurons and synapses, and is a kind of artificial intelligence. In this specification and the like, the term "neural network" particularly refers to an artificial neural network.

With the use of artificial intelligence, the behavior can be analyzed and utilized efficiently and a subsequent operation can be determined. The repeated operation or information is stored as an experience point that serves as a standard of regularity recognition. General regularity can be predicted from a large amount of data thus accumulated.

For example, environment data is used to integrate data. Data is integrated by collecting a variety of information by various sensors, so that prediction that is more effective than prediction with single data can be made. For example, digital map data, data obtained from a camera, and positional information obtained wirelessly can be given.

In the case where a car driver parks a car in a parking lot, the driving of the driver can be effectively assisted by hierarchical ordered set, utilizing data obtained from a camera, map data, and the like. Alternatively, when a driver switches the driving mode to an automatic driving mode, the car utilizes artificial intelligence and data (a back monitor, a lane tracking camera, and the like) and can stop at a predetermined position in a parking lot.

A large-sized flexible display panel has a problem in yield in a separation process of a glass substrate; therefore, in many cases, using a plurality of panels of the same size can reduce the manufacturing cost. That is, in consideration of cost and yield per large-sized high-resolution panel, defects are more likely to occur as the area separated at a time gets larger, and, in some cases, the cost of a panel that is manufactured by combining four panels of one-quarter size gets lower, for example. In the case where a plurality of display panels the sizes of which are the same as that of a display device using a display panel of a given size are combined, depending on a factory manufacturing the display panel, the manufacturing cost of photomasks can be reduced because the photomasks which are the same as those of the display panel of the given size can be used.

Alternatively, even for display regions having the same areas, a plurality of display panels whose terminal portions are provided in different positions may be combined. In the above structure, one feature is that a first terminal portion is included on a short side of the first display panel, the position of a second terminal portion is included on a long side of the second display panel, and the connection position of a first external terminal connected to the first terminal portion and the connection position of a second external terminal connected to the second terminal portion are different from each other. The variation of the placement of the display panels can be increased by changing the placement of the terminal portions.

Recently, there has been a movement to computerize a side mirror (also referred to as a door mirror). An attempt to visualize the shot video in an in-car panel by providing a camera or a sensor as well as a side mirror has been made. Moreover, it is said that a car will dispense with a side mirror that protrudes outside in the future. A side mirror has conventionally been made to adjust its position in accordance with a driver's eye level and the position has been adjusted as appropriate; however, in the case where a side mirror is not provided and computerized, the adjustment is difficult. This is because a display panel on which video is displayed is fixed often, in which case an image might be difficult to see, and therefore there has been a problem in safety.

Thus, a state where an image is easily seen can be made in such a manner that one screen is formed by overlapping a plurality of display panels and the driver curves part of the display panel as appropriate. That is, by curving part of the display panel, the driver can see the display panel easily. The in-car design can also be varied. In the case where a camera detects a rapidly approaching vehicle to which attention is to be paid, part of the display panel may be automatically curved to draw attention so that the video display on which the vehicle is displayed may urge the driver to recognize. Curving part of the display panel will shorten the distance from the driver; therefore, it is possible to display information that the driver having poor eyesight can easily see.

According to another embodiment of the present invention, in the above structure, one feature is that the first display panel or the second display panel has flexibility and has a position adjustment function of curving the end portion. The position adjustment function of curving the end portion of the display panel is provided with a member with which the periphery of the end portion is changed into a protruded state on the rear side of the display panel, and the member may be mechanical or manual one. According to another embodiment of the present invention, which is not limited to the use of a plurality of display panels, a display device includes a display panel having an organic light-emitting element over a flexible film; an optical film over the display panel; and below an overlap between the optical film and the flexible film, a position adjustment jig curving an end portion of the display panel; and both the optical film and the flexible film are curved by a driving mechanism of the position adjustment jig of curving the end portion of the display panel. Note that the optical film and the flexible film, whose materials are different from each other, are preferably not fixed to each other with an adhesive because the end portions of the different films are shifted and the entire end portion of the display panel can be curved smoothly. Curving the end portion of the display panel and displaying video corresponding to a side mirror in the curved region can display information that a driver can easily see. For example, driving the position adjustment jig in synchronization with the operation of a direction indicator by a driver to curve the end portion of the display panel can assist driving by displaying the side mirror video on the curved region as well as drawing driver's attention.

Note that the display device in which a plurality of display panels are combined can be applied to the periphery of a driver's seat (also referred to as a cockpit portion) of various kinds of vehicles such as a large-sized vehicle, a middle-sized vehicle, and a small-sized vehicle (including a motorcycle). In addition, application to the periphery of a driver's seat of a vehicle such as an aircraft or a vessel is also possible.

The display device in which a plurality of display panels are combined can be incorporated along a surface including a curved surface of the inner wall (including a seat and a ceiling) of a car without being limited to the cockpit portion in the periphery of a driver's seat.

The display device in which a plurality of display panels are combined can also be applied to an automatic driving vehicle in which a driver (a pilot or an operator such as a crewmember) can switches the driving mode to an automatic driving mode.

In the case of the automatic driving vehicle, the driving mode is switched automatically when a sensor or the like detects whether a hand contacts with a handle or not or switched by a driver's input operation. For safety's sake, it is preferable to make a clear difference by video display so that a driver can know exactly whether the vehicle is in automatic driving or not. Therefore, it is preferable that the display be performed in a large area so that not only a driver but all of the members that get in the vehicle can see and recognize switching display of automatic driving even when they face whichever direction.

In the case of switching the driving mode from automatic driving to manual driving, driving mode is switched when a driver recognizes setting or the like in automatic driving; therefore, more information can be obtained as a display region displaying such information gets larger.

In addition, display under strong external light in the daytime and display in night are quantitatively different from each other by comparison and how a driver sees the display is likely to change. Even when the environment outside the vehicle is changed, a state where an image is easily seen can be obtained in such a manner that one screen is formed by overlapping a plurality of display panels and part of the display panel is curved as appropriate by a driver. That is, by curving part of the display panel, the driver can see the display panel easily.

According to one embodiment of the present invention, a display device is not limited to being installed inside a vehicle. In some cases, a driver performs operation wirelessly from outside a remote-led car by a remote operation. Switching between automatic driving and a remote operation might also be possible. In that case, a driver's seat is provided indoors, for example, at home; a display device of one embodiment of the present invention is placed in the periphery of the driver's seat; video shot by a camera provided in the remote-led car is displayed; and a driver performs a remote operation in the needed place using the video and automatic driving is performed in other places. It is preferable to employ a high-resolution display panel using an organic EL element in the case where the landscape seen from the driver's seat over a windshield is displayed in video. Particularly at high-speed driving, a vivid moving image in accordance with driving speed, on which external environment that changes in accordance with the driving speed is displayed, is required. The response speed of the organic EL element is remarkably higher than that of a liquid crystal display element; therefore, appropriate information can be provided and information almost in real time can be provided for a driver. Because the display device in which a plurality of display panels are combined uses video data independently, it is suitable for compressing each of the data and transmitting and receiving the data wirelessly.

Effect of the Invention

Driver's safe driving can be ensured by providing a display region with a large area for a user such as a driver and using information displayed on the display region with a large area.

BRIEF DESCRIPTION OF THE DRAWINGS

FIGS. 5A-5G Cross-sectional views illustrating an example of a manufacturing method of a display panel.

FIGS. 9A-9B Cross-sectional views illustrating an example of a display panel.

MODE FOR CARRYING OUT THE INVENTION

Figure 1A:
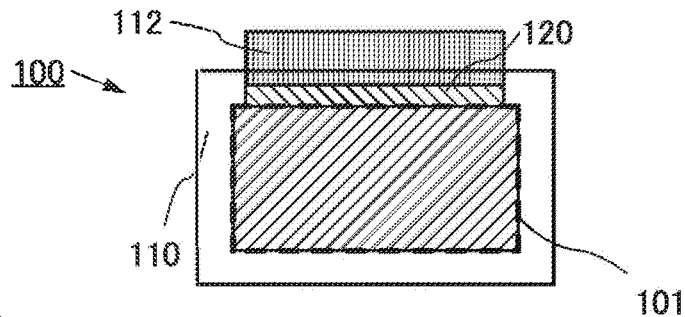
FIGS. 1A-1D Top views and cross-sectional views illustrating one embodiment of the present invention.

Embodiments of the present invention will be described in detail below by referring to the drawings. However, the present invention is not limited to the description below, and it is easily understood by those skilled in the art that modes and details disclosed herein can be modified in various ways. Further, the present invention is not construed as being limited to description of the embodiments given below.

Embodiment 1

In this embodiment, a structure example and an application example of a display device of one embodiment of the present invention will be described with reference to drawing.

Structure Example 1

FIG. 1(A) is a schematic top view of a display panel 100 included in a display device of one embodiment of the present invention.

The display panel 100 includes a display region 101 and a visible-light-transmitting region 110 and is adjacent to the display region 101. An example in which the display panel 100 is provided with an FPC (Flexible Printed Circuit) 112 which is a kind of external terminal is illustrated in FIG. 1(A).

The display region 101 includes a plurality of pixels arranged in a matrix and can display an image. One or more display elements are provided in each pixel. As the display element, typically, a light-emitting element such as an organic EL element, a liquid crystal element, or the like can be used.

In the region 110, for example, a pair of substrates included in the display panel 100, a sealant for sealing the display element sandwiched between the pair of substrates, and the like may be provided. Here, for members provided in the region 110, materials having a visible-light-transmitting property are used. The region 110, in which no wiring, element, or the like is provided except for the substrate and the sealant, is a visible-light-transmitting region.

Here, the width W of the region 110 in FIG. 1(A) is preferably greater than or equal to 0.5 mm and less than or equal to 150 mm, further preferably greater than or equal to 1 mm and less than or equal to 100 mm, still further preferably greater than or equal to 2 mm and less than or equal to 50 mm. The region 110 functions as a sealing region, and as the width W of the region 110 becomes larger, the distance between an end surface of the display panel 100 and the display region 101 can become longer; therefore, entry of an impurity such as water into the display region 101 from the outside can be effectively suppressed. In particular, in this structure example, the region 110 is provided adjacent to the display region 101; thus, it is important to set the width W of the region 110 at an appropriate value. For example, in the case where an organic EL element is used as the display element, the width W of the region 110 is set to be greater than or equal to 1 mm, whereby deterioration of the EL element can be effectively suppressed. Note that also in a portion other than the region 110, the distance between the end portion of the display region 101 and the end surface of the display panel 100 is preferably set to be in the above range.

In a region 120, for example, a wiring electrically connected to the pixels included in the display region 101 is provided. In addition to such a wiring, driver circuits for driving the pixels (such as a scan line driver circuit and a signal line driver circuit) may be provided. Furthermore, the region 120 includes a region provided with a terminal electrically connected to the FPC 112 (also referred to as a connection terminal), a wiring electrically connected to the terminal, an IC chip, and the like.

Figure 1B:
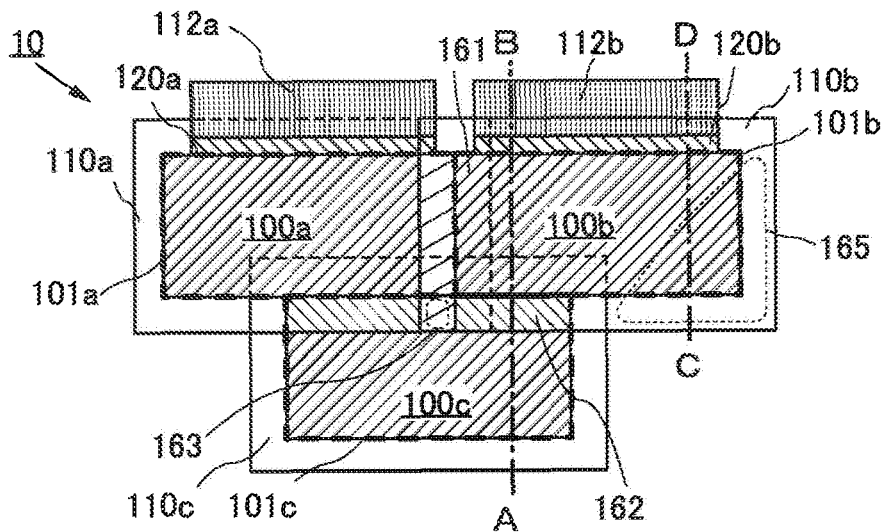

A display device 10 of one embodiment of the present invention includes a plurality of the above display panels 100. FIG. 1(B) is a schematic top view of the display device 10 including three display panels 100a, 100b, and 100c.

Note that hereinafter, to distinguish the display panels from each other, the same components included in the display panels from each other, or the same components relating to the display panels from each other, alphabets are added after reference numerals. Unless otherwise specified, "a" is added to a display panel and components placed on the lowest side (the side opposite to the display surface side), and to one or more display panels and components sequentially placed thereover, alphabets are added in alphabetical order after reference numerals. Unless otherwise specified, in describing a structure in which a plurality of display panels is included, alphabets are not added when a common part of the display panels or the components is described.

The display device 10 illustrated in FIG. 1(B) is provided with a display region 101a, a display region 101b, and a display region 101c, and includes one optical film (typically circular polarizing film) overlapping with all of these display regions. Although optical films can be separately attached, in that case, steps are generated and a boundary is likely to be noticed when an optical film overlaps with an adjacent panel. In the case where optical films are separately attached, maximum three optical films overlap with one another. It is preferable that one optical film be used in common and three display panels be placed to overlap partly with the optical film because overlapping portions are reduced and the surface seems flat. Note that in FIG. 1(B), a portion 163 is a place where the three display panels overlap with one another.

The display panel 100b is placed partly overlapping with an upper side (a display surface side) of the display panel 100a. Specifically, a visible-light-transmitting region 110b of the display panel 100b is placed to overlap with the display region 101a of the display panel 100a.

In a portion 161, a visible-light-transmitting region 110a of the display panel 100a placed on the lower side overlaps with the display region 101b of the display panel 100b placed on the upper side. In a portion 162, the display region 101c of the display panel 100c placed on the lower side overlaps with the visible-light-transmitting region 110b of the display panel 100b placed on the upper side.

The display panel 100c is placed partly overlapping with a lower side (a rear surface side) of the display panel 100b. Specifically, a visible-light-transmitting region 110c of the display panel 100c is placed to overlap with the display region 101b of the display panel 100b, and an FPC of the display panel 100c is placed to overlap with the display region 101b of the display panel 100b.

The visible-light-transmitting region 110b overlaps the display region 101a; thus, the whole display region 101a can be visually seen from the display surface side. The visible-light-transmitting regions 110a and 110b overlap the display region 101c; thus, the whole display region 101c can be visually seen from the display surface side. A region where the display region 101a, the display region 101b, and the display region 101c are placed so that a seam is inconspicuous can serve as one display region of the display device 10. The one display region of the display device 10 has a substantially T-shape as illustrated in FIG. 1(B).

FIG. 1(B) illustrates the case where the same display panel 100 is used for all the three display panels.

Figure 1C:
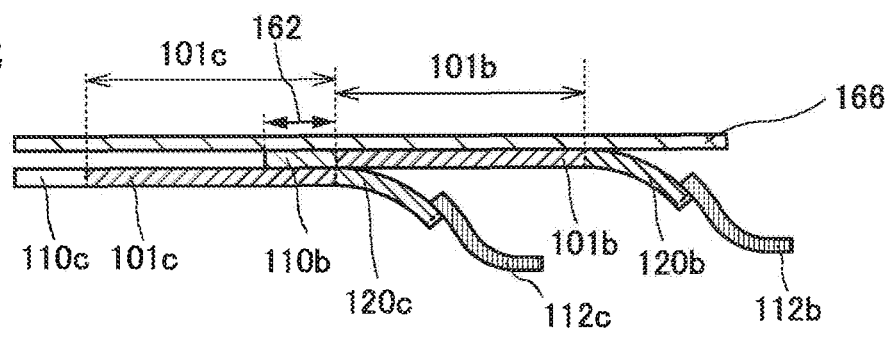

A schematic diagram of the display device 10 taken along a chain line AB in FIG. 1(B) is illustrated in FIG. 1(C). Note that in FIG. 1(C), for easy understanding, the display region 101a, the display region 101c, the region 110b, a region 120b, and a region 120c are illustrated to include a film to be a base.

The display device 10 has a structure in which an optical member 166 is placed on the outermost surface.

The optical member 166 is provided in contact with at least the display region 101b. FIG. 1(C) illustrates an example in which the optical member 166 overlaps with the entire areas of the display panels. The optical member 166 and each of the display panels may be fixed at least partly with an adhesive or the like, or may not be fixed at all. For example, the optical member 166 and each of the display panels may be independently fixed to the display device 10 or a housing included in an electronic device.

As the optical member 166, one or more of a polarizing member, a retardation member, an anti-reflection member, and the like can be used in an overlapping state. Moreover, hard coat treatment may be performed on the outermost surface of the optical member 166.

Examples of the polarizing member include a polarizing plate and a polarizing film Examples of the retardation member include a retardation plate and a retardation film Examples of the anti-reflection member include an anti-reflection film (also referred to as AR film), a low-reflection film (also referred to as LR film), and an anti-glare film (also referred to as AG film or non-glare film) Furthermore, an anti-reflection plate and an anti-reflection film that each have the same function as that of any of these films are also examples of the anti-reflection member.

In this embodiment, an example in which a circularly polarizing plate is used as the optical member 166 is described. The circularly polarizing plate includes a linear polarizing plate and a retardation plate. The linear polarizing plate includes, for example, a linear polarizing layer between a pair of substrates. An example of a retardation plate includes a ¼ λ plate. The linear polarizing plate and the retardation plate are attached to each other with a bonding layer. With the use of the circularly polarizing plate, a user of the display device can be prevented from seeing an overlapping area because of the reflection of light at surfaces and the inside of the display panels.

Figure 1D:
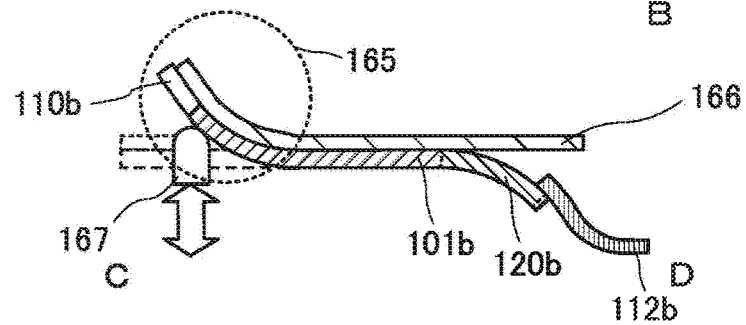

A portion 165 illustrated in FIG. 1(B) is a deformation place. A schematic diagram of the display device 10 taken along a chain line CD in FIG. 1(B) is illustrated in FIG. 1(D).

When the end portion of the display region 101b is push by a position adjustment unit 167, part of the display region 101b is curved and becomes the portion 165 which is deformed in a protruded state. By curving part of the display panel, it can be easily seen. The design of the display device 10 can also be varied.

In the case of moving the position adjustment unit 167, the optical member 166 and the display panel are preferably not fixed with an adhesive or the like. In the case where the position adjustment unit 167 is moved to curve the display panel, the display panel can be curved more smoothly when the optical member 166 and the display panel are not bonded to each other. The position adjustment unit 167 includes a motor, a jig, a hinge, and the like.

Embodiment 2

In this embodiment, application examples in which the display device described in the above embodiment is placed in a vehicle will be described below.

Figure 2:
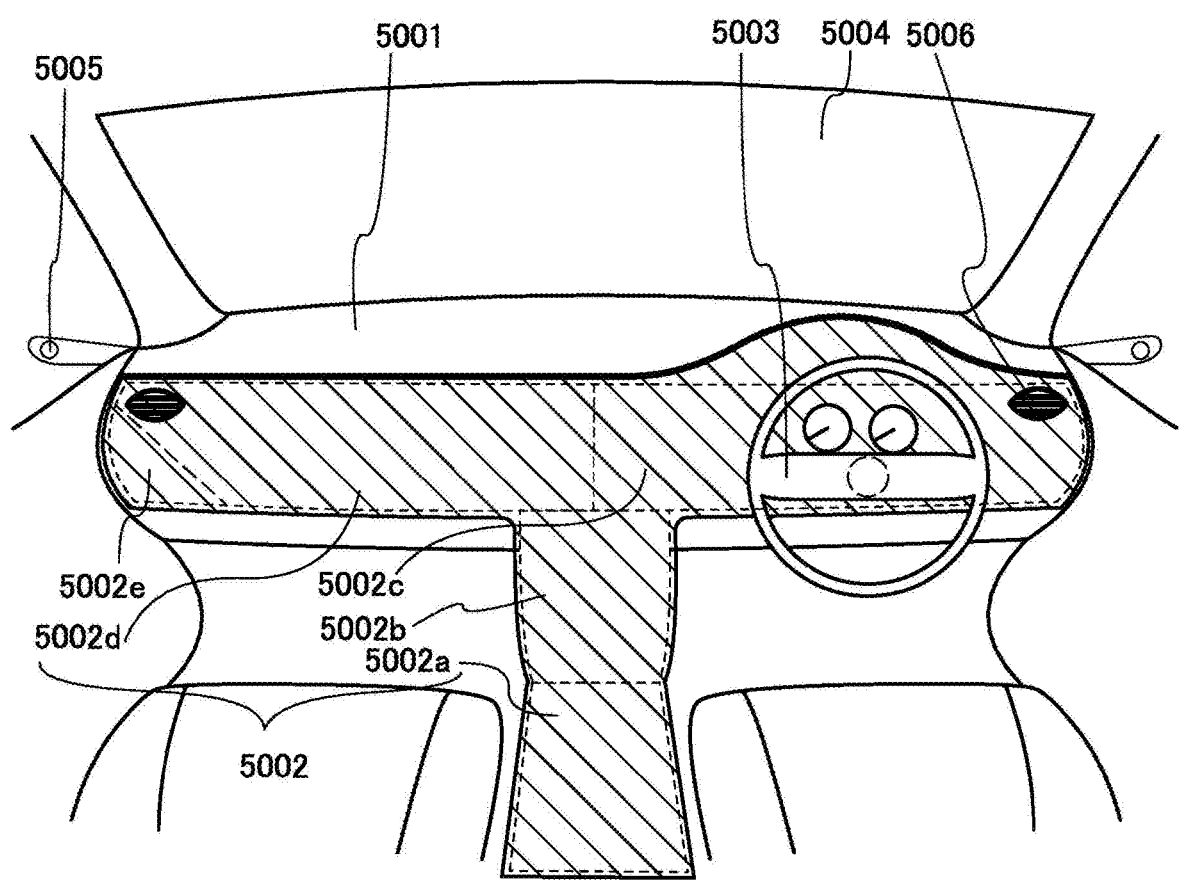
FIG. 2 A diagram illustrating an example of installing a display device of one embodiment of the present invention to a vehicle.

FIG. 2 illustrates an example of installing a display device 5002 to a right-hand vehicle, but there is no particular limitation. In the case of a left-hand vehicle, the placement of the left and right is replaced.

FIG. 2 illustrates a dashboard 5001, a handle 5003, a windshield 5004, and the like which are placed around a driver's seat and a front passenger's seat.

The display device 5002 is placed in a predetermined position in the dashboard 5001, specifically, around the driver, and has a substantial T-shape. The substantial T-shape is preferable because a display region can be provided in front of the driver's seat, in front of the front passenger's seat, and between the driver's seat and the front passenger's seat in the car. FIG. 2 illustrates an example in which a plurality of display panels are combined into one display device 5002 on the curved surface of the dashboard 5001; however, the number of display devices is not limited to one, and a plurality of display devices may be provided separately in a plurality of places. The one display device 5002 illustrated in FIG. 2 has a complex shape which includes a plurality of openings and does not include display regions in a handle connection portion, a display portion of a meter, a ventilation duct 5006, and the like. Achieving such a complex shape is one of the advantages of using a flexible display panel.

A plurality of cameras 5005 for shooting the situation on the rear side are provided outside the car. Although the camera 5005 is provided instead of a side mirror in the example of FIG. 2, both the side mirror and the camera for shooting the situation of the rear side may be provided.

The camera 5005 can be a CCD camera or a CMOS camera, or an infrared camera may be combined to them. The infrared camera can detect or extract a living body such as a human or an animal because as the temperature of the object increases, the output level increases.

An image taken with the camera 5005 can be output to the screen of the display device 5002 (one or a plurality of display regions 5002a, 5002b, 5002c, and 5002d). Note that the display device 5002, in which, for example, the display region 5002a corresponds to one display panel, is broadly composed of four display panels.

This display device 5002 is mainly used for drive support. The situation on the rear side is shot at a wide angle of view in the horizontal direction by the camera 5005, and the image is displayed so that the driver can see a blind area to avoid an accident.

For the display regions 5002a, 5002b, 5002c, and 5002d, the use of a display system including a correction circuit having a function of correcting a video signal using artificial intelligence (AI) is preferably used to display a video in which a seam between videos of adjacent display regions is inconspicuous. Specifically, a correction circuit capable of correcting a video signal so that discontinuity of the video particularly at the seam between the regions can be relieved by learning of an artificial neural network (ANN) is used. Inference (recognition) is made by the artificial neural network after the learning, whereby a video signal is corrected to compensate for discontinuity of a video. This makes it possible to display the video in which a seam is inconspicuous, so that the quality of a high-resolution video can be improved.

Since the display region 5002d of the display device 5002 is flexible, the angle of a screen that is part of the display region 5002d can be changed to an angle easy for the driver to see by curving a left-edge portion 5002e using a position adjustment unit. It is hard to recognize display of the edge of the display region 5002d due to the distance and viewing angle from the driver; however, when the left-edge portion 5002e of the display region 5002d is curved to have an angle the driver can easily see, the edge of the display region 5002d can be provided at a position suitable for a display region where an image of a side mirror is displayed in the car, which is useful.

A distance image sensor may be provided over a roof or the like of the car to display an obtained image on the display device 5002. As the distance image sensor, an image sensor or a LIDAR (Light Detection and Ranging) is used. When an image obtained by a distance image sensor and an image obtained by a CCD camera are displayed on a display device whose display area is large, more information can be provided to the driver to support the driving.

When the display device 5002 also displays map information, traffic information, a television picture, a DVD picture, and the like, more display panels are preferably combined to increase the display area of the display device. For example, map information can be displayed largely on the display regions 5002a, 5002b, 5002c, and 5002d as one display screen.

In the display regions 5002*a*, 5002*b*, 5002*c*, and 5002*d*, the regions displaying video are not fixed and can be freely changed to meet the driver's preference. For example, a television picture and a DVD picture can be displayed in the display region 5002*d* on the left, map information can be displayed in the display region 5002*b* at the center position, meters can be displayed in the display region 5002*c* on the right, and audio information can be displayed in the display region 5002*a* near a transmission gear between the driver's seat and the front passenger's seat. Owing to the combination of a plurality of display panels, a fail-safe design can be achieved. For example, even when one display panel in a display region composed of a plurality of display panels is broken for any reason, display regions to be used can be switched so that a display panel in another region can alternatively be used.

In the case of a flat display panel, the installation place is limited and there is dead space between the display panel and a curved surface of the interior car body, so that the in-car space is narrowed. The display panels used for the display regions 5002*a*, 5002*b*, 5002*c*, and 5002*d* are desirably flexible display panels because the display panels can be installed along the curved surface of the interior car body and therefore the in-car space is hardly narrowed. Note that a flat display panel may be provided in combination with a flexible display panel as long as the in-car space is not narrowed so much. For example, the display region 5002*a* may be a flat display panel. Alternatively, the display region 5002*a*, which is a region that the driver can reach, may be a touch panel so that input operation can be performed.

Figure 15:
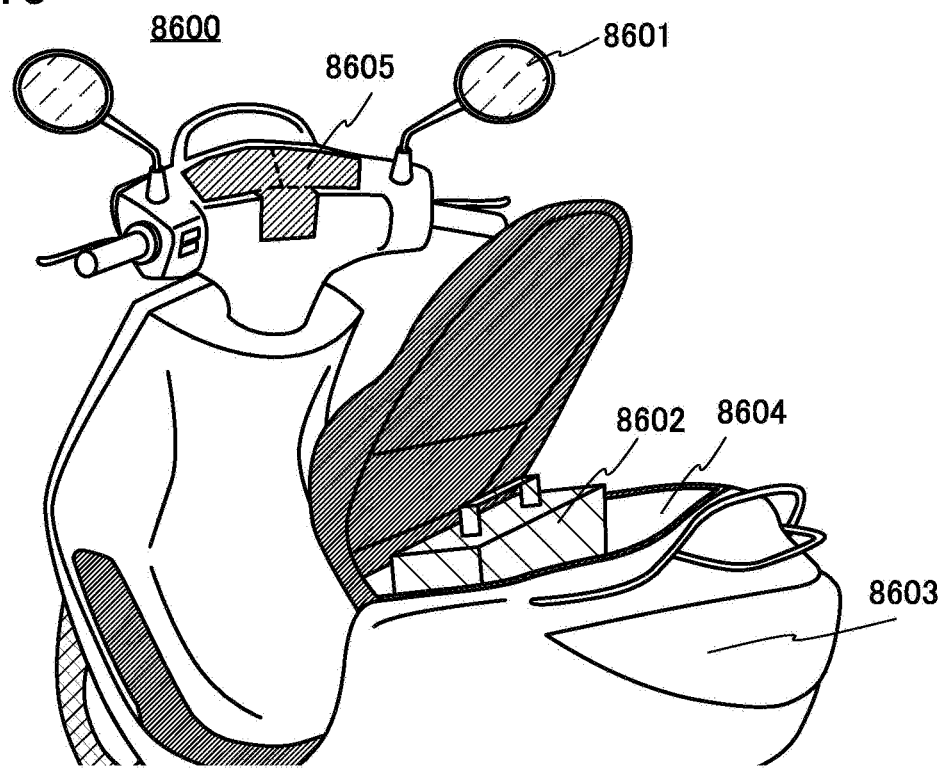
FIG. 15 A perspective view illustrating an example of a display device.

Although the example in which the display panel is applied to a dashboard of a vehicle is described in this embodiment, one embodiment of the present invention is not particularly limited and, for example, an example of a motorcycle such as a motor scooter is illustrated in FIG. 15.

The display device 8605 is placed near a driver's front handlebar, specifically, around the driver, and has a substantial T-shape. The display device 8605 is composed of three display panels and can perform display by switching between speed meter display, navigation display, back monitor display, and the like as appropriate.

Moreover, the display device of this embodiment can also be used as a display device in a cockpit of an aircraft. Alternatively, the display device of this embodiment can be provided in a micro mobility, which is a kind of electric vehicle.

A motor scooter 8600 illustrated in FIG. 15 includes a display device 8605, a power storage device 8602, side mirrors 8601, and indicators 8603. The power storage device 8602 stored in a trunk 8604 can supply electric power to the display device 8605 and the direction indicators 8603.

For another example, the display device of this embodiment may be used for a boarding-type mobile assistive robot that has a plane to put the foot between the two wheels and moves by passenger's movement of the center of gravity and the like.

Alternatively, the display device of this embodiment can also be used as a display device for digital signage mounted on a structure such as a cylindrical column. The display device of this embodiment can also be incorporated along a curved surface of the inner wall or the outer wall of a house or a building.

This embodiment can be freely combined with Embodiment 1.

Embodiment 3

Although the same display panel 100 is used for all of the three display panels in FIG. 1(B) shown in Embodiment 1, FIG. 3 illustrates an example of using a partly different display panel in this embodiment. Note that the display panel in this embodiment is different only partly and the portions in FIG. 3 which are the same as those in FIG. 1 are denoted by the same reference numerals.

Figure 3A:
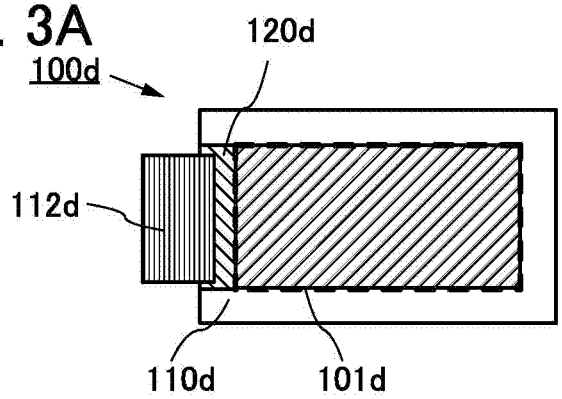
FIGS. 3A-3C Top views illustrating one embodiment of the present invention.

FIG. 3(A) is a schematic top view of a display panel 100*d* included in a display device of one embodiment of the present invention.

The display panel 100*d* includes a display region 101*d*, a visible-light-transmitting region 110*d* that is adjacent to the display region 101*d*, and a region 120*d*. In FIG. 3(A), the region 120*d* is provided with an FPC 112*d* that is a kind of external terminal. In the display panel 100*d*, the area of the display region 101*d* is almost the same area as that of the display region 101 of the display panel 100 illustrated in FIG. 1(A), but the position of the region 120, where the FPC is provided, is different.

Figure 3B:
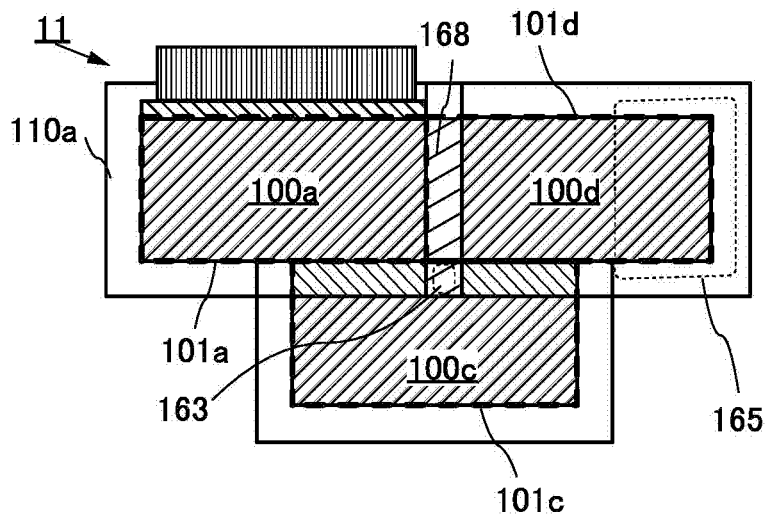

In a display device 11 of one embodiment of the present invention, three display panels are combined in total: two display panels 100 illustrated in FIG. 1(A) and one display panel 100*d* illustrated in FIG. 3(A). FIG. 3(B) shows a schematic top view of the display device 11 including the three display panels 100*a*, 100*c*, and 100*d*.

In the display device 11 illustrated in FIG. 3(B), the display region 101*a*, the display region 101*c*, and the display region 101*d* are placed almost without a space therebetween, and one optical film (typically circular polarizing film) overlapping with all of these display regions is provided. Note that in FIG. 1(B), the portion 163 is a place where the three display panels overlap with one another.

The display panel 100*d* is placed partly overlapping with a lower side of the display panel 100*a*. Specifically, the display region 101*a* of the display panel 100*a* is placed on the upper side and placed so that the region 120*d* and the FPC 112*d* of the display panel 100*d* overlap with the region 110*a*. The place where the visible-light-transmitting region 110*a* of the display panel 100*a* provided on the upper side and the display panel 100*d* provided on the lower side overlap with each other is illustrated as a portion 168. An image is displayed on the portion 168 of the display panel 100*d* with light transmitted from the region 110*a*.

Although the region 120 including a portion connected to the FPC can be deformed as compared with the display region 101, it is difficult in some cases to deform repeatedly. In FIG. 3(B), the display panel 100*d* is used instead of the display panel 100*b* in FIG. 1(B), so that the area of the portion 165 to be a deformation place can be increased. By an increase in the area of the portion 165, the display panel can be deformed so that a driver and the like can see more image information at a position that can be easily seen. Particularly the hood of a large vehicle such as a truck is wide and a display panel can be provided up to a place far from a driver; therefore, it is useful to deform part of the display panel at a far place to be seen easily.

Figure 3C:
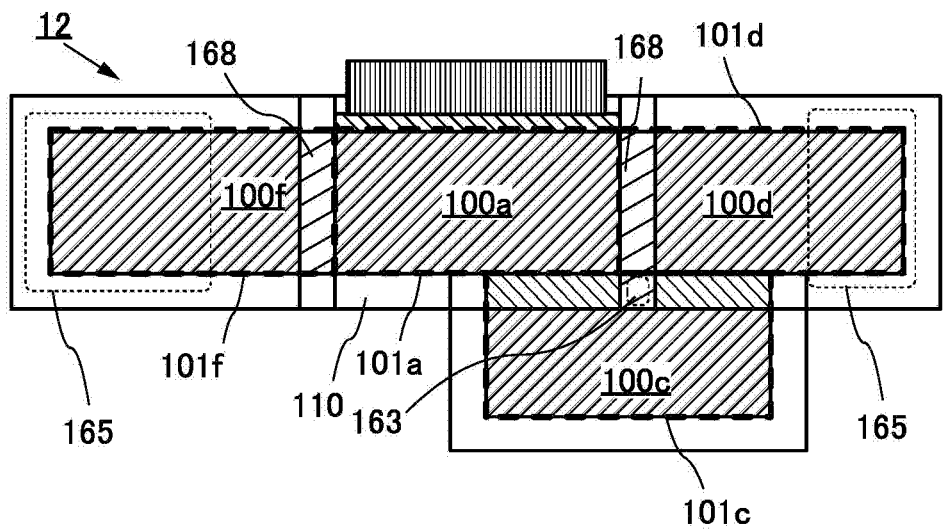

FIG. 3(C) is illustrated as a modification example of FIG. 3(B). FIG. 3(C) illustrates a display device 12 further combined with a display panel 100*f*. One display region in the display device 12 is the sum of the display region 101*a*, the display region 101*d*, the display region 101*c*, and a display region 101*f*. In this specification, the shape of such one display region is referred to as a T-shape. In FIG. 3(C), the portion 165 to be a deformation place can be provided on both sides of the display device 12.

Figure 4:
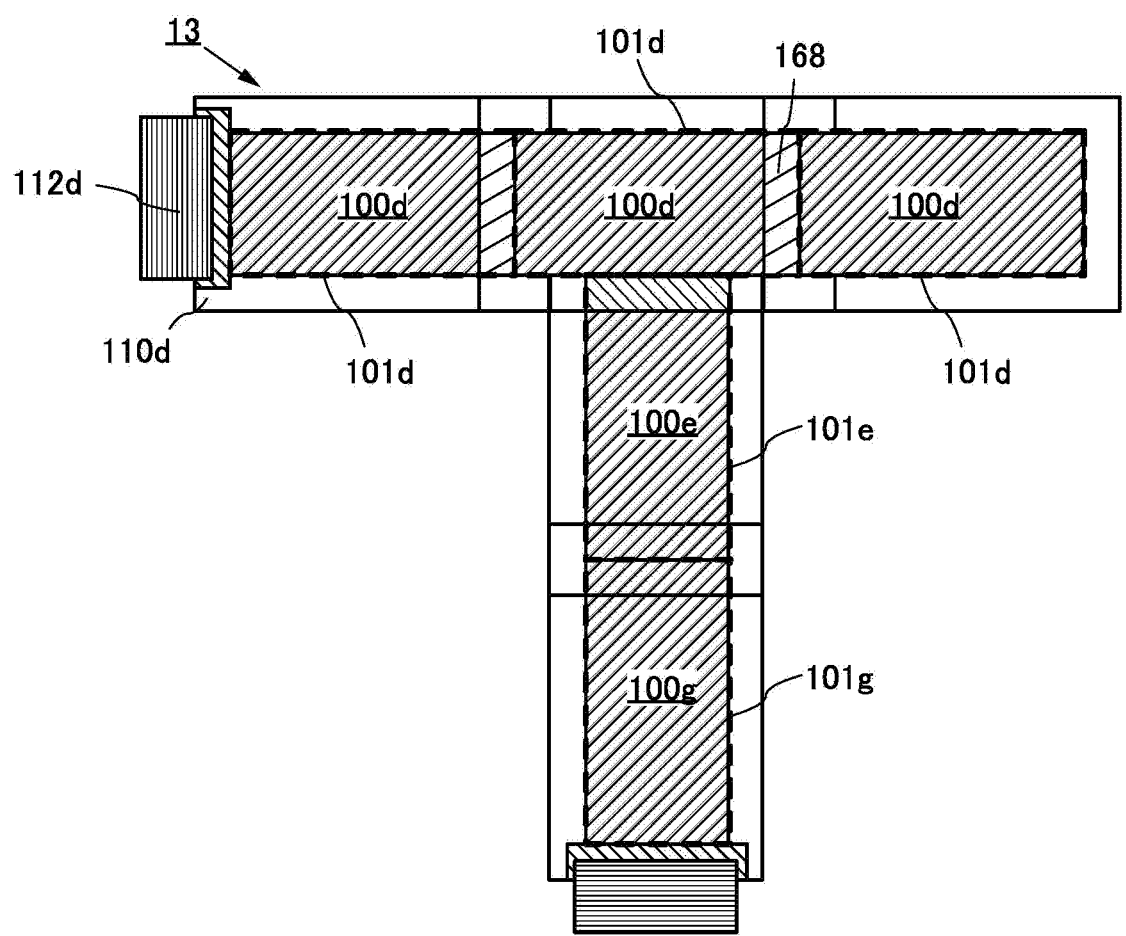
FIG. 4 A top view illustrating one embodiment of the present invention.

FIG. 4 is illustrated as a modification example of FIG. 3(B). FIG. 4 illustrates a display device 13 in which the three display panels 100*d* are arranged transversely and two display panels 100*e* and 100*g* are arranged longitudinally.

One display region in the display device 13 is the sum of the three display regions 101d, a display region 101e, and a display region 101g. In this specification, the shape of such one display region is referred to as a T-shape. The T-shape is a kind of shape in which a longitudinal bar portion and a lateral bar portion are combined, which is formed at substantially 90°, so that long-axis directions intersect with each other. The T-shape is not limited to the shape in which the two bars are made in contact with each other near the center of the lateral bar, i.e. a symmetrical shape.

In addition, in FIG. 4, the three display panels are placed so as not to overlap with one another, and the display device 13 does not include a portion where the three display panels overlap with one another. Although not illustrated, an FPC of the display panel 100e is placed in a position overlapping with the display panel 100d.

In addition, in the three display panels 100d of the display device 13 which are arranged, the left panel in FIG. 4 is placed in the uppermost part, the right panel is placed in the lowermost part, and an FPC of the middle panel is placed so as to overlap with the display region of the left display panel.

In FIG. 4, the display panel 100e may have a shape with a curved surface, and the display panel 100g may be a liquid crystal display device using a conventional glass substrate. In this case, the display surface of the display panel 100d can be curved at an angle greater than or equal to 60° and less than or equal to 120° with respect to the flat plane of the display panel.

A display device including a display region with a large area can be provided by such a variety of combinations. The display devices can be combined as appropriate along a cockpit of a car, an aircraft, or a vessel.

This embodiment can be freely combined with the other embodiments.

Embodiment 4

In this embodiment, a manufacturing method of the display panel of one embodiment of the present invention illustrated in FIG. 1(A) will be described with reference to FIG. 5.

First, as illustrated in FIG. 5(A), a separation layer 233 is formed over a formation substrate 231. Then, plasma treatment is performed on a surface of the separation layer 233 (see the arrows indicated by dotted lines in FIG. 5(A)). Note that in this specification, a layer formed over a separation layer may be referred to as a layer to be separated.

As the formation substrate 231, a substrate having heat resistance high enough to withstand at least process temperature in a manufacturing process is used. As the formation substrate 231, for example, a glass substrate, a quartz substrate, a sapphire substrate, a semiconductor substrate, a ceramic substrate, a metal substrate, or a plastic substrate can be used.

Note that it is preferable to use a large-sized glass substrate as the formation substrate 231 in order to improve mass productivity. For example, a glass substrate having a size greater than or equal to the 3rd generation (550 mm×650 mm) and less than or equal to the 10th generation (2950 mm×3400 mm) or a glass substrate having a larger size than this is preferably used.

In the case where a glass substrate is used as the formation substrate 231, a base film is preferably formed between the formation substrate 231 and the separation layer 233 because contamination from the glass substrate can be prevented. Examples of the base film include insulating films such as a silicon oxide film, a silicon oxynitride film, a silicon nitride film, and a silicon nitride oxide film.

As the separation layer 233, an inorganic material can be used. Examples of the inorganic material include a metal, an alloy, a compound, and the like that contain an element selected from tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal. A high-melting point metal material such as tungsten, titanium, or molybdenum is preferably used for the separation layer 233 because the degree of freedom of the process for forming the layer to be separated can be increased.

In the case where the separation layer 233 has a single-layer structure, a tungsten layer, a molybdenum layer, or a layer containing a mixture of tungsten and molybdenum is preferably formed. Note that the mixture of tungsten and molybdenum corresponds to an alloy of tungsten and molybdenum, for example.

The separation layer 233 can be formed by, for example, a sputtering method, a CVD (Chemical Vapor Deposition) method (a plasma CVD method, a thermal CVD method, a MOCVD (Metal Organic CVD) method, or the like), an ALD (Atomic Layer Deposition) method, a coating method (including a spin coating method, a droplet discharge method, a dispensing method, or the like), a printing method, or an evaporation method.

The thickness of the separation layer 233 is greater than or equal to 1 nm and less than or equal to 1000 nm, preferably greater than or equal to 1 nm and less than or equal to 200 nm, further preferably greater than or equal to 10 nm and less than or equal to 100 nm.

In the case where, as the separation layer 233, a stacked-layer structure of a layer containing tungsten and a layer containing an oxide of tungsten is formed, the following manner may be utilized: the layer containing tungsten is formed and an oxide insulating film is formed thereover, so that the layer containing an oxide of tungsten is formed at the interface between the tungsten layer and the insulating film.

Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment can be performed under an atmosphere of oxygen, nitrogen, or nitrous oxide alone, or a mixed gas of any of these gasses and another gas.

Surface condition of the separation layer 233 is changed by the plasma treatment or heat treatment, whereby adhesion between the separation layer 233 and the insulating film formed later can be controlled. In this embodiment, the case where plasma treatment is performed will be described as an example.

The plasma treatment is preferably performed under an atmosphere containing nitrous oxide, further preferably under an atmosphere containing nitrous oxide and silane. Thus, an oxide layer of a material included in the separation layer 233 can be formed on the surface of the separation layer 233. In particular, when the plasma treatment is performed under an atmosphere containing silane, an oxide layer with an extremely small thickness can be formed. When having an extremely small thickness, the oxide layer is difficult to observe in a cross-sectional observation image.

The oxide layer is a layer containing an oxide of the material included in the separation layer. In the case where a metal is contained in the separation layer 233, the oxide layer is a layer containing an oxide of the metal contained in the separation layer 233. The oxide layer preferably contains tungsten oxide, titanium oxide, or molybdenum oxide.

Next, as illustrated in FIG. 5(B), a first insulating layer 205 is formed over the separation layer 233, and a second insulating layer 207 is formed over the first insulating layer 205.

Although the example in which the stacked-layer structure of the layer containing tungsten and the layer containing an oxide of tungsten is used as the separation layer 233 is described in this embodiment, without particular limitation thereon, the following manner may be employed: with the use of an organic resin such as polyimide, the organic resin and the first insulating layer 205 are stacked over a formation substrate, and a separation trigger is formed by locally heating part of the organic resin by laser light or the like, so that separation is performed at an interface between the formation substrate and the first insulating layer 205.

As each of the first insulating layer 205 and the second insulating layer 207, a single layer or a multilayer using a silicon nitride film, a silicon oxynitride film, a silicon oxide film, a silicon nitride oxide film, or the like can be formed.

Note that in this specification, "silicon oxynitride" contains more oxygen than nitrogen in its composition. Moreover, in this specification, "silicon nitride oxide" contains more nitrogen than oxygen in its composition.

The first insulating layer 205 preferably contains oxygen and silicon. The first insulating layer 205 preferably has a single-layer structure of a silicon oxide film or a silicon oxynitride film.

It is preferable that the first insulating layer 205 further contain hydrogen. The first insulating layer 205 has a function of releasing hydrogen in a later heating step. Hydrogen is released from the first insulating layer 205 by heating, whereby hydrogen is supplied to the oxide layer. The first insulating layer 205 may further have a function of releasing hydrogen and nitrogen in the later heating step. When nitrogen is released from the first insulating layer 205 by heating, nitrogen is supplied to the oxide layer.

The first insulating layer 205 preferably includes a region in which the hydrogen concentration, which is detected by secondary ion mass spectrometry (SIMS), is greater than or equal to $1.0 \times 10^{20}$ atoms/cm$^3$ and less than or equal to $1.0 \times 10^{22}$ atoms/cm$^3$, preferably greater than or equal to $5.0 \times 10^{20}$ atoms/cm$^3$ and less than or equal to $5.0 \times 10^{21}$ atoms/cm$^3$.

The first insulating layer 205 preferably includes a region in which the nitrogen concentration, which is detected by SIMS, is greater than or equal to $5.0 \times 10^{20}$ atoms/cm$^3$ and less than or equal to $1.0 \times 10^{23}$ atoms/cm$^3$, preferably greater than or equal to $1.0 \times 10^{21}$ atoms/cm$^3$ and less than or equal to $5.0 \times 10^{22}$ atoms/cm$^3$.

As the first insulating layer 205, a silicon oxide film or a silicon oxynitride film is preferably formed by a plasma CVD method using a deposition gas containing a silane gas and a nitrous oxide gas because a large amount of hydrogen and nitrogen can be contained in the film. In addition, the proportion of the silane gas in the deposition gas is preferably higher because the amount of released hydrogen in a later heating step is increased.

The second insulating layer 207 preferably contains nitrogen and silicon. The second insulating layer 207 preferably has a single-layer structure of a silicon nitride film or a silicon nitride oxide film or a stacked-layer structure including a silicon nitride film or a silicon nitride oxide film. In the case where the second insulating layer 207 has a stacked-layer structure, the second insulating layer 207 preferably further includes at least one of a silicon oxide film and a silicon oxynitride film.

The second insulating layer 207 has a function of blocking hydrogen released from the first insulating layer 205 in a later heating step. The second insulating layer 207 may be a layer that can block hydrogen and nitrogen. By the second insulating layer 207, supply of hydrogen (and nitrogen) from the first insulating layer 205 to an element layer can be suppressed and hydrogen (and nitrogen) can be supplied to the oxide layer efficiently. Note that another layer may be included between the first insulating layer 205 and the second insulating layer 207.

A silicon nitride film included in the second insulating layer 207 is preferably formed by a plasma CVD method using a deposition gas containing a silane gas, a nitrogen gas, and an ammonia gas.

The first insulating layer 205 and the second insulating layer 207 can each be formed by a sputtering method, a plasma CVD method, a coating method, a printing method, or the like, and can be a dense film having an excellent moisture-resistant property by being formed at a deposition temperature higher than or equal to 250° C. and lower than or equal to 400° C. by a plasma CVD method, for example. Note that each thickness of the first insulating layer 205 and the second insulating layer 207 is preferably greater than or equal to 10 nm and less than or equal to 3000 nm, further preferably greater than or equal to 200 nm and less than or equal to 1500 nm.

Next, the separation layer 233, the first insulating layer 205, and the second insulating layer 207 are heated. Note that the heat treatment may be performed after at least part of an element layer 209 described later is formed. For example, the heat treatment may be performed after a transistor is formed and before the display element is formed. In the case where a heating step is included in the manufacturing process of the element layer 209, the heating step may also serve as the heat treatment.

By performing the heat treatment, hydrogen (and nitrogen) is released from the first insulating layer 205 to be supplied to the oxide layer. At this time, the second insulating layer 207 blocks the released hydrogen (and nitrogen); thus, hydrogen (and nitrogen) can be efficiently supplied to the oxide layer.

The oxide in the oxide layer is reduced by hydrogen supplied to the oxide layer, so that a plurality of oxides with different proportions of oxygen are mixed in the oxide layer. For example, in the case where tungsten is contained in the separation layer, $WO_3$ formed by plasma treatment is reduced to generate tungsten oxide $WO_x$ ($2<x<3$) and $WO_2$ with a proportion of oxygen lower than that of $WO_3$, leading to a state where these are mixed. Such a mixed metal oxide shows different crystal structures depending on the proportion of oxygen; thus, the mechanical strength of the oxide layer is reduced. As a result, a state that is likely to be damaged is achieved inside the oxide layer, so that the separability in a later separation process can be improved.

In addition, a compound containing a material contained in the separation layer and nitrogen is also generated by nitrogen supplied to the oxide layer. Existence of such a compound can further weaken the mechanical strength of the oxide layer, so that the separability can be increased. In the case where a metal is contained in the separation layer, a compound containing the metal and nitrogen (a metal nitride) is generated in the oxide layer. For example, in the case where tungsten is contained in the separation layer, tungsten nitride is generated in the oxide layer.

As the amount of hydrogen supplied to the oxide layer is larger, $WO_3$ is more likely to be reduced and a state where a plurality of oxides with different proportions of oxygen are mixed is more likely to be formed in the oxide layer; therefore, the force required for the separation can be reduced. As the amount of nitrogen supplied to the oxide layer is larger, the mechanical strength of the oxide layer can be weakened and the force required for the separation can be reduced. The thickness of the first insulating layer 205 is preferably larger because the amount of released hydrogen (and nitrogen) can be increased. On the other hand, the first insulating layer 205 preferably has a smaller thickness because the productivity is increased.

The heat treatment may be performed at a temperature higher than or equal to the temperature at which hydrogen (and nitrogen) is desorbed from the first insulating layer 205 and lower than or equal to the temperature at which the formation substrate 231 is softened. The heating is preferably performed at a temperature higher than or equal to the temperature at which the reduction reaction of the metal oxide in the oxide layer with hydrogen occurs. The higher the temperature of the heat treatment is, the larger the amount of the hydrogen (and nitrogen) desorbed from the first insulating layer 205 is; thus, subsequent separability can be improved. Note that depending on heating time and heating temperature, the separability may be so high that separation may occur at an unintended timing. Thus, in the case where tungsten is used for the separation layer 233, the heating is performed at a temperature higher than or equal to 300° C. and lower than 700° C., preferably higher than or equal to 400° C. and lower than 650° C., further preferably higher than or equal to 400° C. and lower than or equal to 500° C.

Although the atmosphere in which the heat treatment is performed is not particularly limited and may be an air atmosphere, it is preferably performed in an inert gas atmosphere such as nitrogen or a rare gas.

Next, as illustrated in FIG. 5(C), the second insulating layer 207 in the visible-light-transmitting region 110 is removed. A dry etching method, a wet etching method, or the like can be used for the removal of the second insulating layer 207. Note that any of etching steps included in later manufacturing processes of the element layer 209 or the like may also serve as the removal step of the second insulating layer 207.

In one embodiment of the present invention, the second insulating layer 207 is provided over the entire surface of the separation layer 233 until the heat treatment is performed. Then, after the heat treatment, the second insulating layer 207 in the visible-light-transmitting region 110 is removed. Accordingly, the separability in the visible-light-transmitting region 110 can be prevented from being lower than that in the other region. Thus, the separability of the entire display panel can be uniform. An influence of the structure of the visible-light-transmitting region 110 on the yield of the manufacturing process of the display panel can be reduced.

Next, as illustrated in FIG. 5(D), the element layer 209 and a connection terminal 223 are formed over the second insulating layer 207. The display element is included in the element layer 209. It is preferable that an insulating layer included in the element layer 209 be not included in the visible-light-transmitting region 110.

Next, a substrate 235 attached to the formation substrate 231 in a later step is prepared. A separation layer 237 is formed over the substrate 235. Then, plasma treatment is performed on a surface of the separation layer 237 (see the arrows indicated by dotted lines in FIG. 5(E)).

Next, as illustrated in FIG. 5(F), a third insulating layer 215 is formed over the separation layer 237, a fourth insulating layer 217 is formed over the third insulating layer 215, and a functional layer 219 is formed over the fourth insulating layer 217.

Note that heat treatment is performed after the fourth insulating layer 217 is formed and before part of the fourth insulating layer 217 is removed. The separation layer 237, the third insulating layer 215, and the fourth insulating layer 217 may be heated before the functional layer 219 is formed. Alternatively, the heat treatment may be performed after at least part of the functional layer 219 is formed. In the case where a heating step is included in the manufacturing process of the functional layer 219, the heating step may also serve as the heat treatment.

By performing the heat treatment, the separability in a later separation process can be improved.

Next, as illustrated in FIG. 5(G), the fourth insulating layer 217 in the visible-light-transmitting region 110 is removed. A dry etching method, a wet etching, or the like can be used for the removal of the fourth insulating layer 217. Note that any of etching steps included in the manufacturing process of the functional layer 219 may also serve as the removal step of the fourth insulating layer 217.

In one embodiment of the present invention, the fourth insulating layer 217 is provided over the entire surface of the separation layer 237 until the heat treatment is performed. Then, after the heat treatment, the fourth insulating layer 217 in the visible-light-transmitting region 110 is removed. Accordingly, the separability of the entire display panel can be uniform. An influence of the structure of the visible-light-transmitting region 110 on the yield of the manufacturing process of the display panel can be reduced.

Figure 6A:
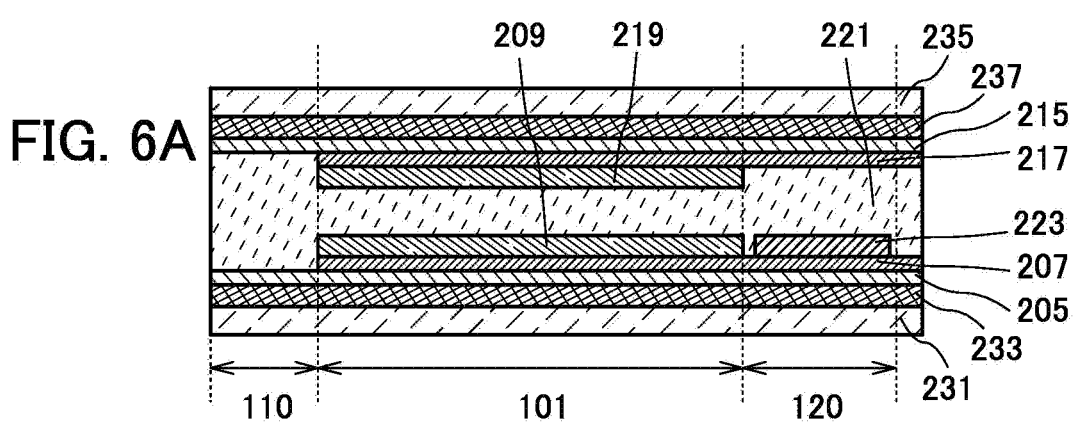
FIGS. 6A-6C Cross-sectional views illustrating an example of a manufacturing method of a display panel.

Next, the formation substrate 231 and the substrate 235 are attached to each other with a bonding layer 221 (see FIG. 6(A)).

As the bonding layer 221, a variety of curable adhesives such as a photocurable adhesive such as an ultraviolet curable adhesive, a reactive curable adhesive, a thermosetting adhesive, and an anaerobic adhesive can be used. Alternatively, as the bonding layer 221, an adhesive with which the substrate 235 and the first insulating layer 205 can be separated from each other when necessary, such as a water-soluble resin, a resin soluble in an organic solvent, or a resin which is capable of being plasticized upon irradiation with UV light, may be used.

Then, the separation layer 233 and the first insulating layer 205 are separated from each other.

As the separation method, for example, the formation substrate 231 or the substrate 235 is fixed to a suction stage and a separation starting point is formed between the separation layer 233 and the first insulating layer 205. The separation starting point may be formed by, for example, inserting a sharp instrument such as a knife between them. Alternatively, the separation starting point may be formed by melting part of the separation layer 233 by irradiation with laser light. Alternatively, the separation starting point may be formed by dripping liquid (e.g., alcohol, water, or water containing carbon dioxide) onto an end portion of, for example, the separation layer 233 or the first insulating layer 205 so that the liquid penetrates into an interface between the separation layer 233 and the first insulating layer 205 by using capillary action.

Then, physical force (a separation process with a human hand or with a jig, a separation process by rotation of a roller, or the like) is gently applied to the area where the separation starting point is formed in a direction substantially perpendicular to the bonded surfaces, so that separation can be caused without damage to the layer to be separated. For example, separation may be caused by attaching tape or the like to the formation substrate 231 or the substrate 235 and pulling the tape in the aforementioned direction, or separation may be caused by pulling an end portion of the formation substrate 231 or the substrate 235 with a hook-like member. Alternatively, separation may be caused by adsorbing an adhesive member or a member capable of vacuum suction on the rear side of the formation substrate 231 or the substrate 235 and pulling it up.

Here, separation is caused in such a manner that liquid containing water such as water or an aqueous solution is added to the separation interface at separation and the liquid penetrates into the separation interface, so that the separability can be improved. Furthermore, an adverse influence of static electricity caused at separation on the functional element included in the layer to be separated (breakdown of a semiconductor element by static electricity, or the like) can be reduced.

By the above method, the layer to be separated can be separated from the formation substrate 231 with a high yield.

Figure 6B:
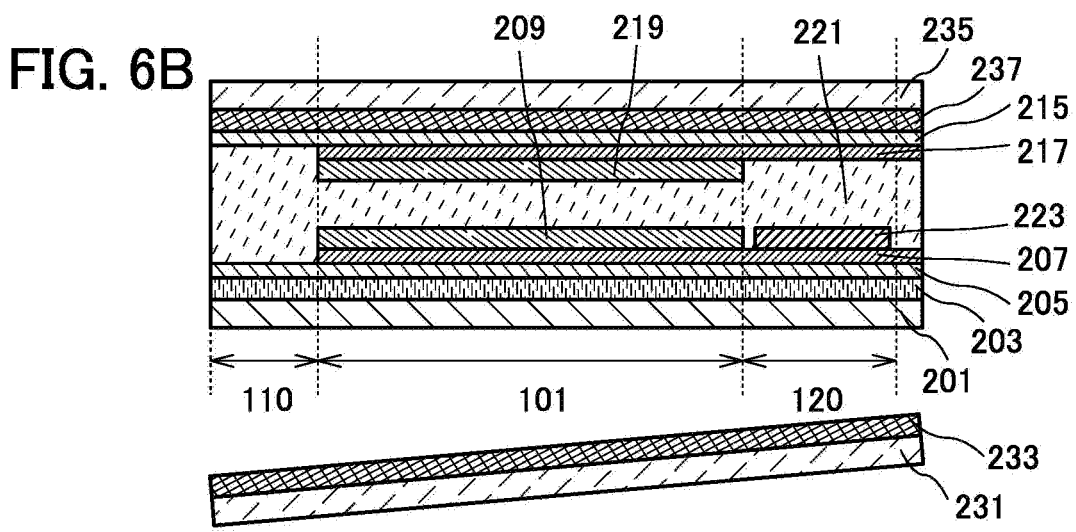

After that, a substrate 201 is attached to the first insulating layer 205 with a bonding layer 203 therebetween (FIG. 6(B)). For the bonding layer 203, a material that can be used for the bonding layer 221 can be used. For the substrate 201, a material that can be used for a substrate 211 described later can be used.

Next, the separation layer 237 and the substrate 235 are separated.

Figure 6C:
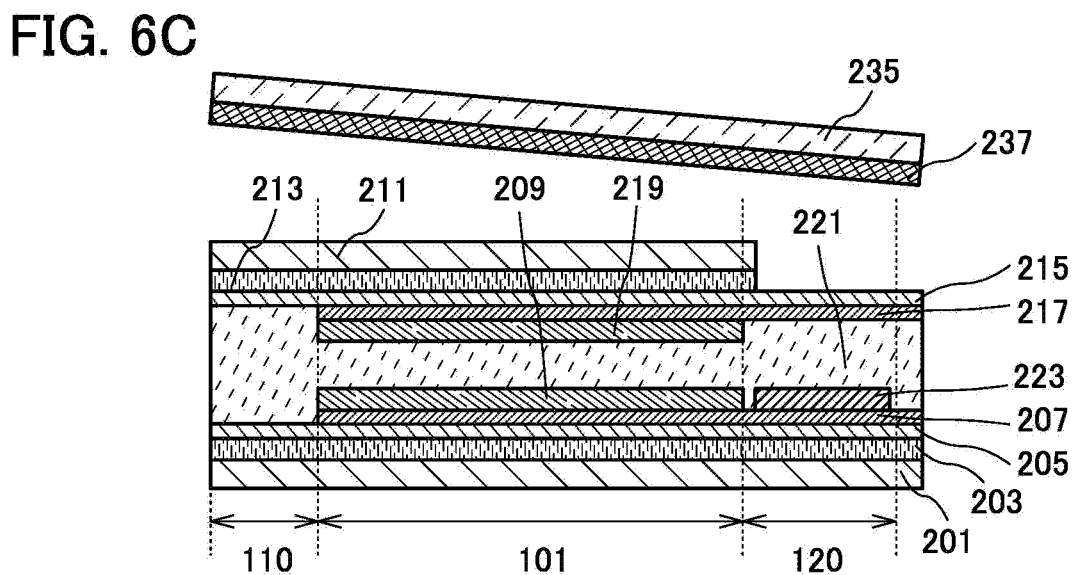

After that, the substrate 211 is attached to the first insulating layer 215 with a bonding layer 213 therebetween (FIG. 6(C)).

As the substrate 211, various substrates that can be used as the formation substrate 231 can be used. Alternatively, a substrate having flexibility may be used. Alternatively, as the substrate 211, a substrate provided in advance with a functional element such as a semiconductor element such as a transistor, a light-emitting element such as an organic EL element, a liquid crystal element, or a sensing element, a color filter, and the like may be used. For the bonding layer 213, a material that can be used for the bonding layer 221 can be used.

By using substrate having flexibility as the substrate 201 and the substrate 211, a flexible display panel can be fabricated. Note that in the case where the substrate 211 functions as a temporary supporting substrate, the substrate 211 and the layer to be separated are separated from each other, and the layer to be separated may be attached to another substrate (e.g., a substrate having flexibility).

As described above, in the manufacturing method of a display panel of one embodiment of the present invention, the heat treatment is performed while the first insulating layer 205 and the second insulating layer 207 are formed over the entire surface of the separation layer 233; thus, the separability of the entire display panel can be uniformly increased. Furthermore, the second insulating layer 207 in the visible-light-transmitting region 110 is removed after the heat treatment, so that the reflectance in the visible-light-transmitting region 110 can be reduced.

Moreover, in the manufacturing method of a display panel of one embodiment of the present invention, a functional element is formed over a formation substrate, separated from the formation substrate, and then transferred to another substrate. Thus, there is almost no limitation on the temperature applied in formation steps of a functional element. A functional element with extremely high reliability that is manufactured through a high-temperature process can be manufactured with a high yield over a substrate having flexibility with poor heat resistance. Accordingly, a highly reliable flexible display panel can be achieved.

In this embodiment, a display panel using an EL element as a display element will be described as an example.

Figure 7A:
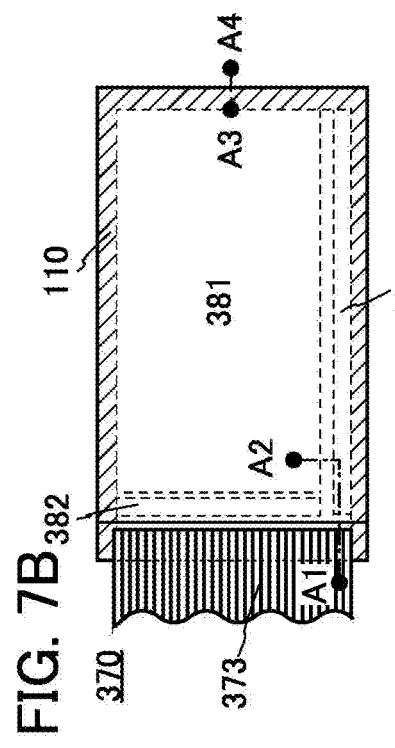
FIGS. 7A-7C Top views and a cross-sectional view illustrating an example of a display panel.
Figure 7B:
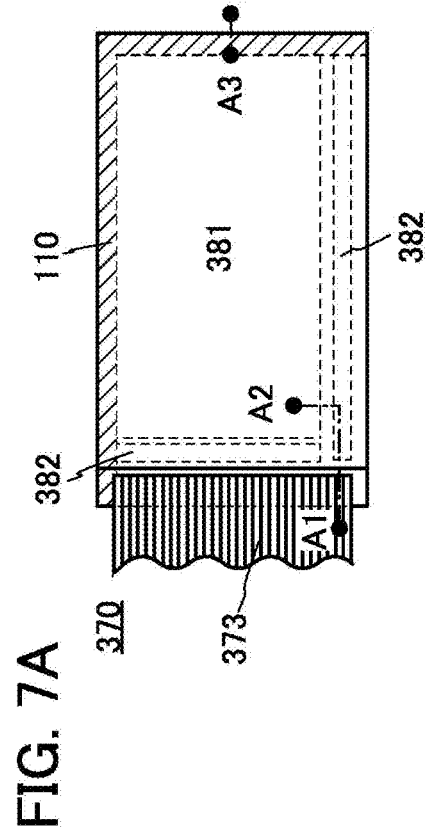

The display panel can have a structure in which subpixels of three colors of R (red), G (green), and B (blue) express one color; a structure in which subpixels of four colors of R, G, B, and W (white) express one color; a structure in which subpixels of four colors of R, G, B, and Y (yellow) express one color; or the like. There is no limitation on color elements, and colors other than R, G, B, W, and Y (e.g., cyan or magenta) may be used. FIGS. 7(A) and 7(B) show top views of a display panel 370.

The display panels 370 illustrated in FIGS. 7(A) and 7(B) each include the visible-light-transmitting region 110, a display portion 381, and a driver circuit portion 382. In FIG. 7(A), an example is shown in which the visible-light-transmitting region 110 is adjacent to the display portion 381 and provided along two sides of the display portion 381. In FIG. 7(B), an example is shown in which the visible-light-transmitting region 110 is adjacent to the display portion 381 and provided along three sides of the display portion 381.

Figure 7C:
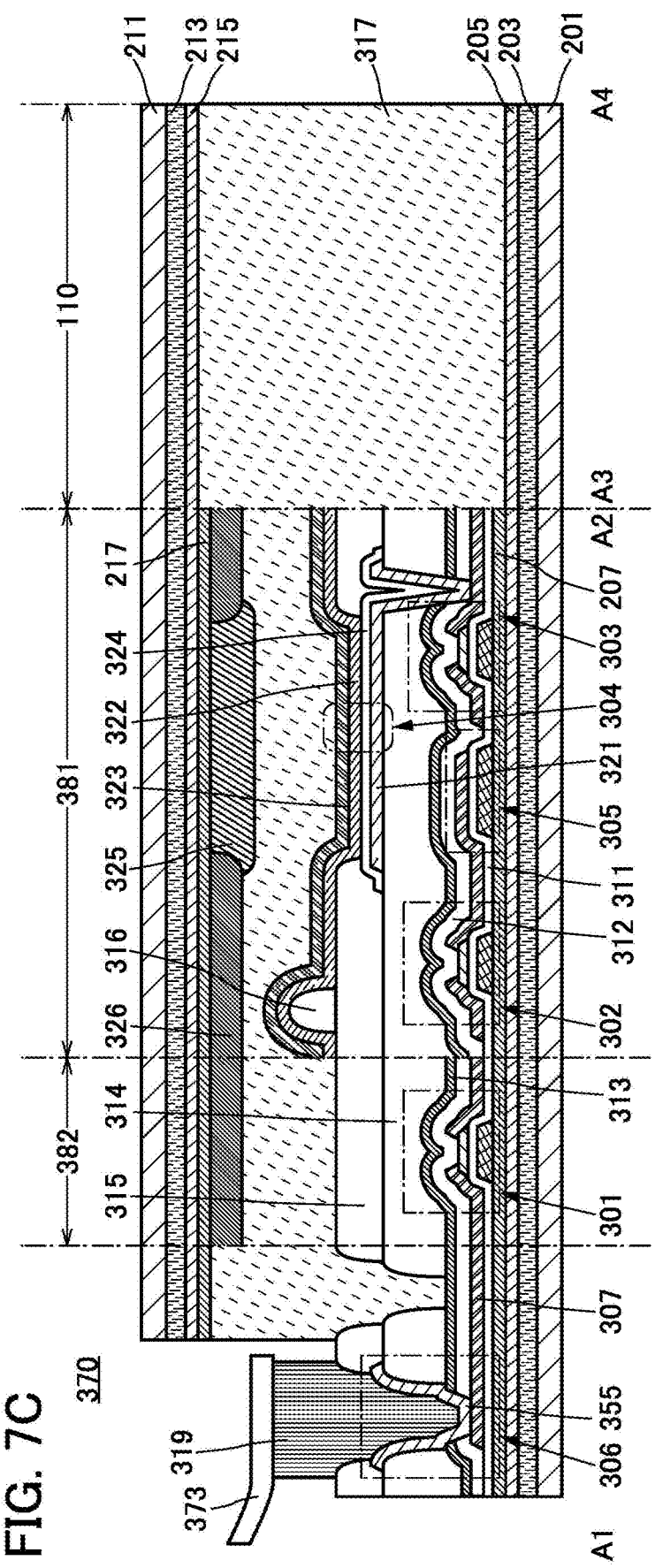

FIG. 7(C) shows a cross-sectional view of the display panel 370 employing a color filter method and having a top-emission structure. FIG. 7(C) corresponds to cross-sectional views along dashed-dotted lines A1-A2 and A3-A4 in FIGS. 7(A) and 7(B).

The display panel 370 includes the substrate 201, the bonding layer 203, the first insulating layer 205, the second insulating layer 207, a plurality of transistors, a capacitor 305, a conductive layer 307, an insulating layer 312, an insulating layer 313, an insulating layer 314, an insulating layer 315, a light-emitting element 304, a conductive layer 355, a spacer 316, a bonding layer 317, a coloring layer 325, a light-blocking layer 326, the substrate 211, the bonding layer 213, the third insulating layer 215, and the fourth insulating layer 217. Each of the layers included in the visible-light-transmitting region 110 transmits visible light.

The driver circuit portion 382 includes a transistor 301. The display portion 381 includes a transistor 302 and a transistor 303.

Each transistor includes a gate, a gate insulating layer 311, a semiconductor layer, a source, and a drain. The gate and the semiconductor layer overlap with each other with the gate insulating layer 311 provided therebetween. Part of the gate insulating layer 311 functions as a dielectric of the capacitor 305. The conductive layer functioning as the source or the drain of the transistor 302 also serves as one electrode of the capacitor 305.

FIG. 7(C) shows a bottom gate transistor. The structure of the transistor may be different between the driver circuit portion 382 and the display portion 381. The driver circuit portion 382 and the display portion 381 may each include a plurality of kinds of transistors.

The capacitor 305 includes a pair of electrodes and the dielectric therebetween. The capacitor 305 includes a conductive layer that is formed using the same material and the same step as the gate of the transistor and a conductive layer that is formed using the same material and the same step as the source and the drain of the transistor.

The insulating layer 312, the insulating layer 313, and the insulating layer 314 are each provided to cover the transistors and the like. The number of the insulating layers covering the transistors and the like is not particularly limited. The insulating layer 314 functions as a planarization layer. A material through which impurities such as water and hydrogen are less likely to be diffused is preferably used for at least one of the insulating layer 312, the insulating layer 313, and the insulating layer 314. Diffusion of impurities from the outside into the transistor can be effectively suppressed, leading to improved reliability of the display panel.

The display panel 370 has a structure in which the reflection of light in the visible-light-transmitting region 110 is suppressed. The visible-light-transmitting region 110 includes the substrate 201, the bonding layer 203, the first insulating layer 205, the bonding layer 317, the third insulating layer 215, the bonding layer 213, and the substrate 211 that are stacked in this order.

The second insulating layer 207, the fourth insulating layer 217, the gate insulating layer 311, the insulating layer 312, the insulating layer 313, the insulating layer 314, and the insulating layer 315 are provided in the display portion 381 and not provided in the visible-light-transmitting region 110. The end portions of these insulating layers are preferably positioned in part of the display portion 381 that is near the boundary between the display portion 381 and the visible-light-transmitting region 110. In addition, the end portions of these insulating layers preferably overlap with the light-blocking layer 326. Thus, variation in reflectance and transmittance can be made small on the plane of the visible-light-transmitting region 110.

The first insulating layer 205 and the substrate 201 are attached to each other with the bonding layer 203. The third insulating layer 215 and the substrate 211 are attached to each other with the bonding layer 213. In the manufacturing method of a display panel of one embodiment of the present invention, the first insulating layer 205 and the third insulating layer 215 are layers positioned in the separation interfaces with the respective formation substrates and provided over the entire surface of the display panel 370. Thus, the display panel 370 can be manufactured with high yield.

In the display portion 381, the light-emitting element 304 is positioned between the second insulating layer 207 and the fourth insulating layer 217. Entry of impurities into the light-emitting element 304 from the thickness direction of the display panel 370 is suppressed. Similarly, a plurality of insulating layers covering the transistors are provided in the display portion 381, and thus entry of impurities into the transistors is suppressed.

The light-emitting element 304, the transistors, and the like are preferably provided between a pair of insulating films having a high moisture-proof property because entry of impurities such as water into these elements can be suppressed, leading to higher reliability of the display panel.

Examples of an insulating film having a high moisture-proof property include a film containing nitrogen and silicon such as a silicon nitride film or a silicon nitride oxide film and a film containing nitrogen and aluminum such as an aluminum nitride film. Alternatively, a silicon oxide film, a silicon oxynitride film, an aluminum oxide film, or the like may be used.

For example, the water vapor permeability of the insulating film having a high moisture-proof property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the case where an organic material is used for the insulating layer 314, impurities such as moisture might enter the light-emitting element 304 and the like from the outside of the display panel through the insulating layer 314 exposed at an end portion of the display panel. Deterioration of the light-emitting element 304 due to the entry of an impurity leads to deterioration of the display panel. Thus, as illustrated in a portion near a connection portion 306 in FIG. 7(C), an opening that reaches an inorganic film (here, the insulating layer 313) is preferably provided in the insulating layer 314 so that an impurity such as moisture entering from the outside of the display panel does not easily reach the light-emitting element 304.

The light-emitting element 304 includes an electrode 321, an EL layer 322, and an electrode 323. The light-emitting element 304 may include an optical adjustment layer 324. The light-emitting element 304 emits light to the coloring layer 325 side.

The transistor, the capacitor, the wiring, and the like are provided to overlap with a light-emitting region of the light-emitting element 304, whereby an aperture ratio of the display portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected from the anode side and electrons are injected from the cathode side to the EL layer 322. The injected electrons and holes are recombined in the EL layer 322 and a light-emitting substance contained in the EL layer 322 emits light.

The electrode 321 is electrically connected to a source or a drain of the transistor 303. These are connected directly or connected through another conductive layer. The electrode 321, which functions as a pixel electrode, is provided for each light-emitting element 304. Two adjacent electrodes 321 are electrically insulated from each other by the insulating layer 315.

The EL layer 322 is a layer containing a light-emitting material. As the light-emitting element 304, an organic EL element including an organic compound as a light-emitting material can be favorably used.

The EL layer 322 includes at least one light-emitting layer.

As a light-emitting material, a quantum dot can also be used. A quantum dot is a semiconductor nanocrystal with a size of several nanometers and contains approximately $1\times10^3$ to $1\times10^6$ atoms. Since energy shift of quantum dots depends on their size, quantum dots made of the same substance emit light with different wavelengths depending on their size; thus, emission wavelengths can be easily adjusted by changing the size of quantum dots to be used.

A quantum dot has an emission spectrum with a narrow peak, leading to emission with high color purity. In addition, a quantum dot is said to have a theoretical internal quantum efficiency of approximately 100%, and a quantum dot can be used as a light-emitting material to obtain a light-emitting element having high light emission efficiency. Furthermore, since a quantum dot that is an inorganic compound has high inherent stability, a light-emitting element that is preferable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of a Group 4 to a Group 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Examples of a material included in a quantum dot include cadmium selenide, cadmium sulfide, cadmium telluride, zinc sulfide, indium phosphide, lead selenide, lead sulfide, a compound of selenium, zinc, and cadmium, and a compound of cadmium, selenium, and sulfur. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the structure of the quantum dot, any of a core type, a core-shell type, a core-multishell type, and the like may be used. It is preferable to use a core-shell or core-multishell quantum dot because the quantum efficiency of light emission can be significantly improved. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. In this manner, cohesion of quantum dots can be prevented and solubility in a solvent can be increased. It can also reduce reactivity and improve electrical stability.

The range of size (diameter) of quantum dots, which is greater than or equal to 0.5 nm and less than or equal to 20 nm, preferably greater than or equal to 1 nm and less than or equal to 10 nm, is usually used. Note that the emission spectra are narrowed as the size distribution of the quantum dots gets smaller, and thus light can be obtained with high color purity. The shape of the quantum dots is not particularly limited and may be a spherical shape, a rod shape, a circular shape, or another shape.

As for quantum dots, even when a light-emitting layer is composed of only quantum dots and made without a host material, light emission efficiency can be ensured; thus, a light-emitting element that is favorable in terms of a lifetime can be obtained. In the case where the light-emitting layer is composed of only quantum dots, the quantum dots preferably have core-shell structures (including core-multishell structures).

The electrode 323, which functions as a common electrode, is provided for a plurality of light-emitting elements 304. A fixed potential is supplied to the electrode 323.

The light-emitting element 304 overlaps with the coloring layer 325 with the bonding layer 317 provided therebetween. The spacer 316 overlaps with the light-blocking layer 326 with the bonding layer 317 provided therebetween. Although FIG. 7(C) illustrates the case where a space is provided between the light-emitting element 304 and the light-blocking layer 326, these may be in contact with each other. Although a structure in which the spacer 316 is provided on the substrate 201 side is illustrated in FIG. 7(C), the spacer 316 may be provided on the substrate 211 side (e.g., on a side closer to the substrate 201 than the light-blocking layer 326).

Owing to the combination of a color filter (the coloring layer 325) and a microcavity structure (the optical adjustment layer 324), light with high color purity can be extracted from the display panel. The thickness of the optical adjustment layer 324 is varied depending on the color of the pixel.

The coloring layer is a colored layer that transmits light in a specific wavelength range. For example, a color filter or the like for transmitting light in a red, green, blue, or yellow wavelength range can be used. Examples of materials that can be used for the coloring layer include a metal material, a resin material, and a resin material containing a pigment or dye.

Note that one embodiment of the present invention is not limited to a color filter method, and a separate coloring method, a color conversion method, a quantum dot method, or the like may be employed.

The light-blocking layer is provided between the adjacent coloring layers. The light-blocking layer blocks light from an adjacent light-emitting element to suppress color mixture between adjacent light-emitting elements. Here, an end portion of the coloring layer is provided so as to overlap with the light-blocking layer, whereby light leakage can be reduced. As the light-blocking layer, a material that blocks light from the light-emitting element can be used; for example, a black matrix can be formed using a metal material or a resin material containing a pigment or dye. Note that the light-blocking layer is preferably provided in a region other than a pixel portion, such as a driver circuit, because unintended light leakage due to guided light or the like can be suppressed.

The connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal that transmits a signal or a potential from the outside to the driver circuit portion 382. Here, an example in which an FPC 373 is provided as an external input terminal is shown. The FPC 373 and the conductive layer 355 are electrically connected to each other through a connector 319.

As the connector 319, various anisotropic conductive films (ACF), anisotropic conductive pastes (ACP), and the like can be used.

The transistors 301, 302, and 303 illustrated in FIG. 9(A) each include two gates, the gate insulating layer 311, a semiconductor layer, a source, and a drain. FIG. 9(A) illustrates an example in which each transistor has a structure in which the semiconductor layer is sandwiched between the two gates. Such a transistor can have higher field-effect mobility and thus have higher on-state current than other transistors. Consequently, a circuit capable of high-speed operation can be manufactured. Furthermore, the area occupied by the circuit can be reduced. With the use of the transistor having a high on-state current, signal delay in each wiring can be reduced and display luminance variation can be reduced even if the number of wirings is increased when the size or resolution of a display panel is increased. In FIG. 9(A), an example in which one of the gates is formed between the insulating layer 313 and the insulating layer 314 is shown.

As illustrated in FIG. 9(A), a display panel preferably includes an overcoat 329. The overcoat 329 can prevent impurities and the like contained in the coloring layer 325 from being diffused into the light-emitting element 304. The overcoat 329 is formed using a material that transmits light from the light-emitting element 304. For example, it is possible to use an inorganic insulating film such as a silicon nitride film or a silicon oxide film or an organic insulating film such as an acrylic film or a polyimide film, and a stacked-layer structure of an organic insulating film and an inorganic insulating film may be employed. In FIG. 9(A), an example in which the overcoat 329 is positioned over the entire surface of the display panel is shown. The overcoat 329 is not necessarily provided in the visible-light-transmitting region 110.

In the case where a material of the bonding layer 317 is coated on the coloring layer 325 and the light-blocking layer 326, a material which has high wettability with respect to the material of the bonding layer 317 is preferably used as the material of the overcoat 329. For example, an oxide conductive film such as an indium tin oxide (ITO) film or a metal film such as an Ag film which is thin enough to have a light-transmitting property is preferably used as the overcoat 329.

The material of the bonding layer 317 can be uniformly coated on the overcoat 329 by using a material which has high wettability with respect to the material of the bonding layer 317. Accordingly, entry of bubbles in attaching the pair of substrates to each other can be suppressed, and thus a display defect can be suppressed.

A substrate having flexibility is preferably used as the substrate 201 and the substrate 211. For example, a material such as glass, quartz, a resin, a metal, an alloy, or a semiconductor thin enough to have flexibility can be used. A material which transmits light from the light-emitting element is used for the substrate on the side from which the light is extracted. For example, the thickness of the substrate is preferably greater than or equal to 1 µm and less than or equal to 200 µm, further preferably greater than or equal to 1 µm and less than or equal to 100 µm, still further preferably greater than or equal to 10 µm and less than or equal to 50 µm, and particularly preferably greater than or equal to 10 µm and less than or equal to 25 µm. The thickness and hardness of the substrate having flexibility are set in the range where mechanical strength and flexibility can be balanced against each other. The substrate having flexibility may have a single-layer structure or a stacked-layer structure.

A resin, which has a specific gravity smaller than that of glass, is preferably used for the substrate having flexibility, because the display panel can be lightweight as compared with the case where glass is used.

A material with high toughness is preferably used for the substrate. In that case, a display panel with high impact resistance that is less likely to be broken can be provided. For example, when a resin substrate or a thin metal or alloy substrate is used, the display panel that is lightweight and less likely to be broken as compared with the case where a glass substrate is used can be achieved.

A metal material and an alloy material are preferable because they have high thermal conductivity and can easily conduct heat to the whole substrate, and a local temperature rise in the display panel can be suppressed. The thickness of a substrate using a metal material or an alloy material is preferably greater than or equal to 10 µm and less than or equal to 200 µm, further preferably greater than or equal to 20 µm and less than or equal to 50 µm.

Although a material that forms the metal substrate or the alloy substrate is not particularly limited, it is favorable to use, for example, aluminum, copper, nickel, or a metal alloy such as an aluminum alloy or stainless steel. Examples of a material that forms a semiconductor substrate include silicon.

Furthermore, when a material with high thermal emissivity is used for the substrate, increase of the surface temperature of the display panel can be suppressed, and breakage or a decrease in reliability of the display panel can be suppressed. For example, the substrate may have a stacked-layer structure of a metal substrate and a layer with high thermal emissivity (e.g., a metal oxide or a ceramic material can be used).

Examples of materials having flexibility and a light-transmitting property include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material whose linear thermal expansion coefficient is reduced is preferably used, and for example, a polyamide imide resin, a polyimide resin, a polyamide resin, PET, or the like can be favorably used. A substrate in which a fibrous body is impregnated with a resin, a substrate whose linear thermal expansion coefficient is reduced by mixing an inorganic filler with a resin, or the like can also be used.

The substrate having flexibility may be formed by stacking a layer using the above-described materials with at least one of a hard coat layer by which a surface of the device is protected from damage or the like (e.g., a silicon nitride layer), a layer of a material which can disperse pressure (e.g., an aramid resin layer), and the like. A substrate that can be used as a protective substrate 132 may be used.

When a glass layer is included in the substrate having flexibility, a barrier property against water and oxygen can be improved and thus a highly reliable display panel can be provided.

For the bonding layer, a variety of curable adhesives such as a photocurable adhesive such as an ultraviolet curable adhesive, a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (calcium oxide, barium oxide, or the like). Alternatively, it is possible to use a substance that adsorbs moisture by physical adsorption, such as zeolite or silica gel. The drying agent is preferably included because entry of impurities such as moisture into the functional element can be suppressed, thereby improving the reliability of the display panel.

When a filler with a high refractive index or a light scattering member is contained in the bonding layer, the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in its category. For example, a light-emitting diode (LED), an organic EL element, an inorganic EL element, or the like can be used. Note that a variety of display elements can be used for the display panel of one embodiment of the present invention. For example, a liquid crystal element, an electrophoretic element, a display element using MEMS, or the like may be used.

The light-emitting element may be of a top-emission, bottom-emission, or dual-emission type. A visible-light-transmitting conductive film is used for the electrode through which light is extracted. A visible-light-reflecting conductive film is preferably used for the electrode through which light is not extracted.

The visible-light-transmitting conductive film can be formed using, for example, indium oxide, ITO, indium zinc oxide, zinc oxide (ZnO), or ZnO to which gallium is added. Alternatively, a metal material such as gold, silver, platinum, magnesium, nickel, tungsten, chromium, molybdenum, iron, cobalt, copper, palladium, or titanium; an alloy containing these metal materials; a nitride of these metal materials (e.g., titanium nitride); or the like can be used when formed thin so as to have a light-transmitting property. Alternatively, a stacked film of the above materials can be used as the conductive film. For example, a stacked film of an alloy of silver and magnesium, and ITO is preferably used, because conductivity can be increased. Alternatively, graphene or the like may be used.

For the visible-light-reflecting conductive film, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (Ag—Pd—Cu, also referred to as APC), or an alloy of silver and magnesium may be used. An alloy containing silver and copper is preferable because of its high heat resistance. Furthermore, when a metal film or a metal oxide film that is in contact with an aluminum alloy film is stacked, oxidation of the aluminum alloy film can be suppressed. Examples of materials of the metal film or the metal oxide film include titanium and titanium oxide. Alternatively, the above visible-light-transmitting conductive film and a film formed of a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The EL layer 322 includes at least a light-emitting layer. The EL layer 322 may include a plurality of light-emitting layers. In addition to the light-emitting layer, the EL layer 322 may further include a layer containing a substance with a high hole-injection property, a layer containing a substance with a high hole-transport property, a layer containing a hole-blocking material, a layer containing a substance with a high electron-transport property, a layer containing a substance with a high electron-injection property, a layer containing a substance with a bipolar property (a substance with a high electron- and hole-transport property), or the like.

Either a low molecular compound or a high molecular compound can be used for the EL layer 322, and an inorganic compound may also be contained. Each of the layers that form the EL layer 322 can be formed by a method such as an evaporation method (including a vacuum evaporation method), a transfer method, a printing method, an inkjet method, or a coating method.

The light-emitting element 304 may contain two or more kinds of light-emitting substances. Thus, for example, a light-emitting element that emits white light can be achieved. A white emission can be obtained by selecting light-emitting substances so that two or more kinds of light-emitting substances emit light of complementary colors, for example. A light-emitting substance that emits light of R (red), G (green), B (blue), Y (yellow), O (orange), or the like or a light-emitting substance that emits light containing spectral components of two or more colors of R, G, and B can be used, for example.

Moreover, the light-emitting element 304 may be a single element including one EL layer or a tandem element including a plurality of EL layers stacked with a charge generation layer provided therebetween.

<Structure Example of Light-Emitting Panel>

Cross-sectional views of display panels 370A and 370B employing a separate coloring method and having a top-emission structure are illustrated in FIG. 9(A) and FIG. 9(B). A color filter is included in FIG. 9(A). If not necessary, a structure without a color filter as illustrated in FIG. 9(B) may be employed. In these cases, light-emitting layers of the light-emitting elements for respective colors are preferably separated. A display device of one embodiment of the present invention is composed of a plurality of display panels, and each display panel can have a relatively small size. Thus, the alignment accuracy of a metal mask can be raised, leading to higher yield in separate coloring. Accordingly, there is an advantage in that light-emitting elements using a separate coloring method are employed.

The structure of the transistors included in the display panel is not particularly limited. For example, a planar transistor may be used, a staggered transistor may be used, or an inverted staggered transistor may be used. Either a top-gate transistor or a bottom-gate transistor may be used. Alternatively, gate electrodes may be provided above and below a channel.

There is no particular limitation on the crystallinity of the semiconductor material used for the transistor, and either an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration in the transistor characteristics can be suppressed.

A semiconductor material used for the transistor is not particularly limited, and for example, a Group 14 element, a compound semiconductor, or an oxide semiconductor can be used for a semiconductor layer. Typically, a semiconductor containing silicon, a semiconductor containing gallium arsenide, an oxide semiconductor containing indium, or the like can be used.

It is particularly preferable to use an oxide semiconductor as a semiconductor in which a channel of the transistor is formed. In particular, an oxide semiconductor having a wider band gap than silicon is preferably used. A semiconductor material having a wider band gap and a lower carrier density than silicon is preferably used because the current in an off state of the transistor can be reduced.

For example, at least indium (In) or zinc (Zn) is preferably contained as the oxide semiconductor. Further preferably, an oxide represented by an In-M-Zn oxide (M is a metal such as Al, Ti, Ga, Ge, Y, Zr, Sn, La, Ce, Hf, or Nd) is contained.

A CAAC-OS (C Axis Aligned Crystalline Oxide Semiconductor) is preferably used as a semiconductor material used for the transistors. Unlike an amorphous state, the CAAC-OS has few defect levels, so that the reliability of the transistor can be improved. Moreover, since the CAAC-OS has a feature in that no grain boundary is observed, a stable and uniform film can be formed over a large area, and stress that is caused by curving a display panel having flexibility does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single-crystal structure, such as a nanocrystal (nc) structure, which is an aggregate of nanoscale microcrystals. A CAAC-OS has lower crystallinity than a single crystal and higher crystallinity than nc.

The CAAC-OS has c-axis alignment, its pellets (nanocrystals) are connected in an a-b plane direction, and the crystal structure has distortion. Thus, the CAAC-OS can also be referred to as an oxide semiconductor including a CAA crystal (c-axis-aligned a-b-plane-anchored crystal).

An organic insulating material or an inorganic insulating material can be used for the insulating layers included in the display panel. Examples of resins include an acrylic resin, an epoxy resin, a polyimide resin, a polyamide resin, a polyimide-amide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the display panel can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a conductive material having a light-transmitting property such as indium oxide, ITO, indium oxide containing tungsten, indium zinc oxide containing tungsten, indium oxide containing titanium, ITO containing titanium, indium zinc oxide, ZnO, ZnO to which gallium is added, or indium tin oxide containing silicon may be used. Alternatively, a semiconductor such as polycrystalline silicon or an oxide semiconductor whose resistance is lowered, for example, by containing an impurity element, or silicide such as nickel silicide may be used. A film containing graphene may be used as well. The film containing graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily coated.

Figure 8:
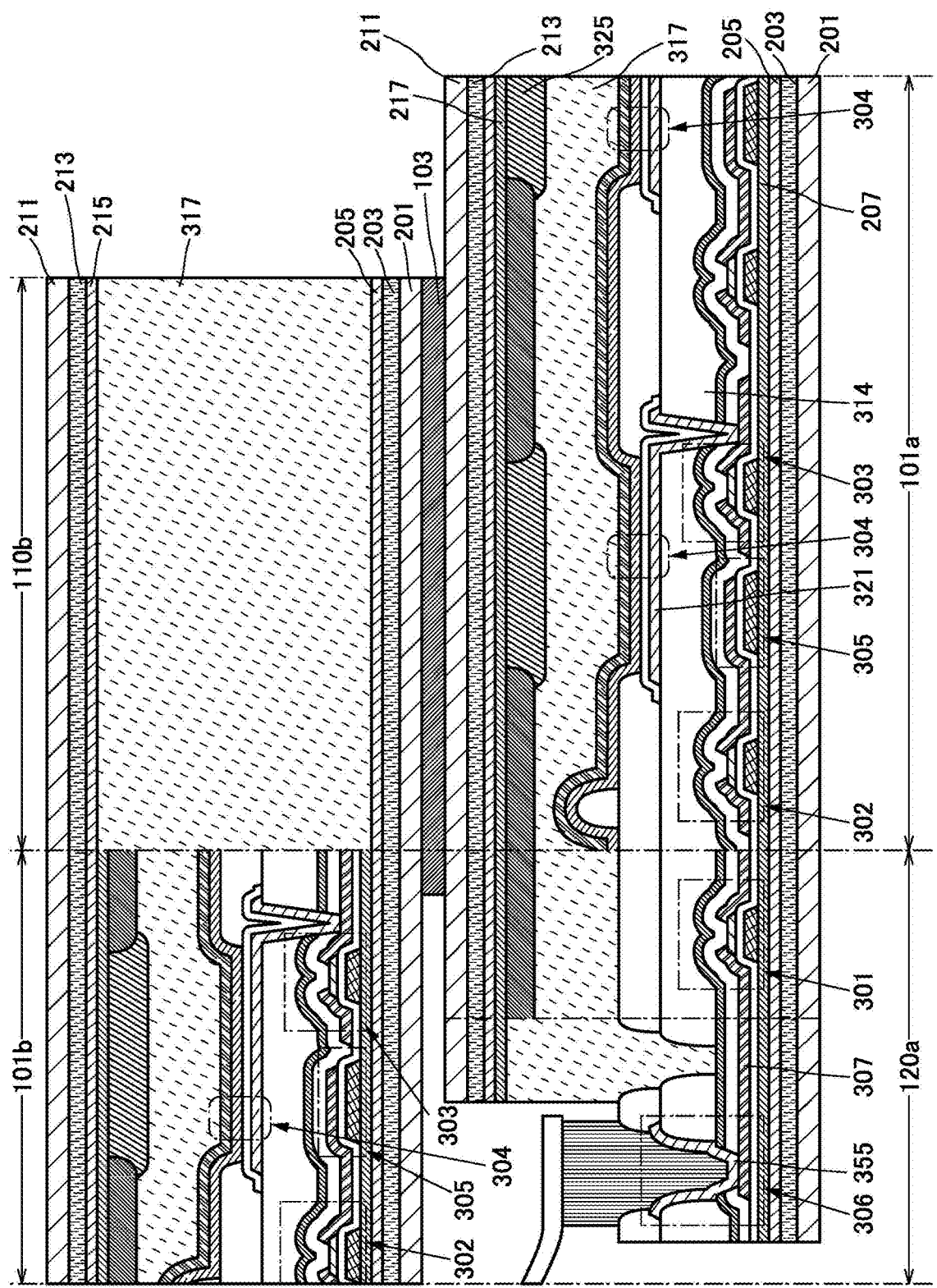
FIG. 8 A cross-sectional view illustrating an example of a display device.

An example of a cross-sectional view of a display device including two display panels 370 illustrated in FIG. 7(C) that overlap with each other is illustrated in FIG. 8.

In FIG. 8, the following are illustrated: the display region 101a (corresponding to the display portion 381 in FIG. 7(C)) and a region 120a that blocks visible light (corresponding to the driver circuit portion 382 and the like in FIG. 7(C)) of a lower display panel, and the display region 101b (corresponding to the display portion 381 in FIG. 7(C)) and the visible-light-transmitting region 110b (corresponding to the visible-light-transmitting region 110 in FIG. 7(C)) of an upper display panel.

In the display device illustrated in FIG. 8, the display panel positioned on the display surface side (upper side) includes the visible-light-transmitting region 110b adjacent to the display region 101b. The display region 101a of the lower display panel overlaps with the visible-light-transmitting region 110b of the upper display panel. Thus, a non-display region between the display regions of the two display panels overlapping with each other can be reduced or even removed. Accordingly, a large display device in which a seam between display panels is less likely to be noticed by a user can be achieved.

The display device illustrated in FIG. 8 includes a light-transmitting layer 103 having a refractive index higher than that of air and transmitting visible light between the display region 101a and the visible-light-transmitting region 110b. Accordingly, entry of air between the display region 101a and the visible-light-transmitting region 110b can be suppressed, so that the interface reflection due to a difference in refractive index can be reduced. In addition, display unevenness or luminance unevenness in the display device can be suppressed.

The light-transmitting layer 103 may overlap with the entire surface of the substrate 211 of the lower display panel or the substrate 201 of the upper display panel, or may overlap with only the display region 101a and the visible-light-transmitting region 110b. In addition, the light-transmitting layer 103 may overlap with the region 120a that blocks visible light.

For example, an adsorption film having adsorption layers on both surfaces of a base material can be used as the light-transmitting layer 103.

The visible-light-transmitting region 110b has a structure in which the reflection of light is suppressed. Thus, a portion in which the two display panels overlap with each other (an overlapping portion) is less likely to be seen by a user of the display device. Moreover, in the display in the display region 101a, a difference in luminance between a portion seen through the visible-light-transmitting region 110b and a portion seen not through the region can be made small.

This embodiment can be freely combined with the other embodiments.

Example 1

In this example, results of fabricating the display device of one embodiment of the present invention will be described. A display device fabricated in this example is a kawara-type multidisplay.

<Display Panel>

First, the display panel used in the display device in this example will be described in detail.

Figure 10A:
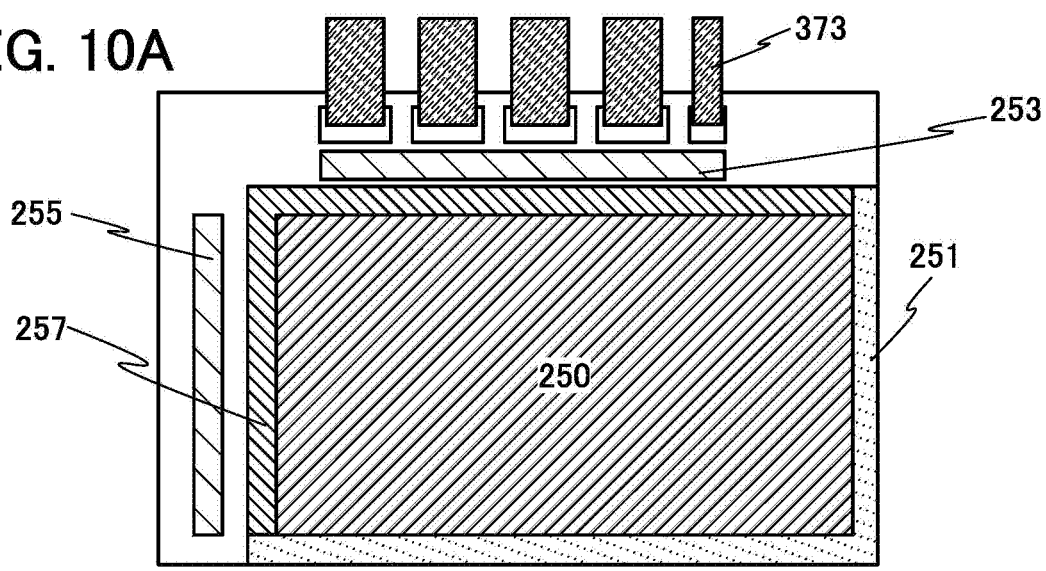
FIGS. 10A-10C Diagrams illustrating a display panel and a display device of Example 1.

A schematic view of the display panel in this example is illustrated in FIG. 10(A). The display panel illustrated in FIG. 10(A) is an active matrix organic EL display that has a light-emitting portion 250 with a diagonal size of 13.5 inches, 1280×720 effective pixels, a resolution of 108 ppi, and an aperture ratio of 41.3%. The display panel includes a built-in demultiplexer (DeMUX) 253, which functions as a source driver. In addition, the display panel also includes a built-in scan driver 255. Two sides of the light-emitting portion 250 are in contact with a visible-light-transmitting region 251. A lead wiring 257 is provided along the other two sides.

A channel-etched transistor including a CAAC-OS was used as the transistor. Note that an In—Ga—Zn-based oxide was used as the oxide semiconductor.

As the light-emitting elements, three types of organic EL elements of RGB were used. A structure in which light from the light-emitting element is extracted to the outside of the display panel through the color filter is employed. The light-emitting element has a top-emission structure.

Figure 10B:
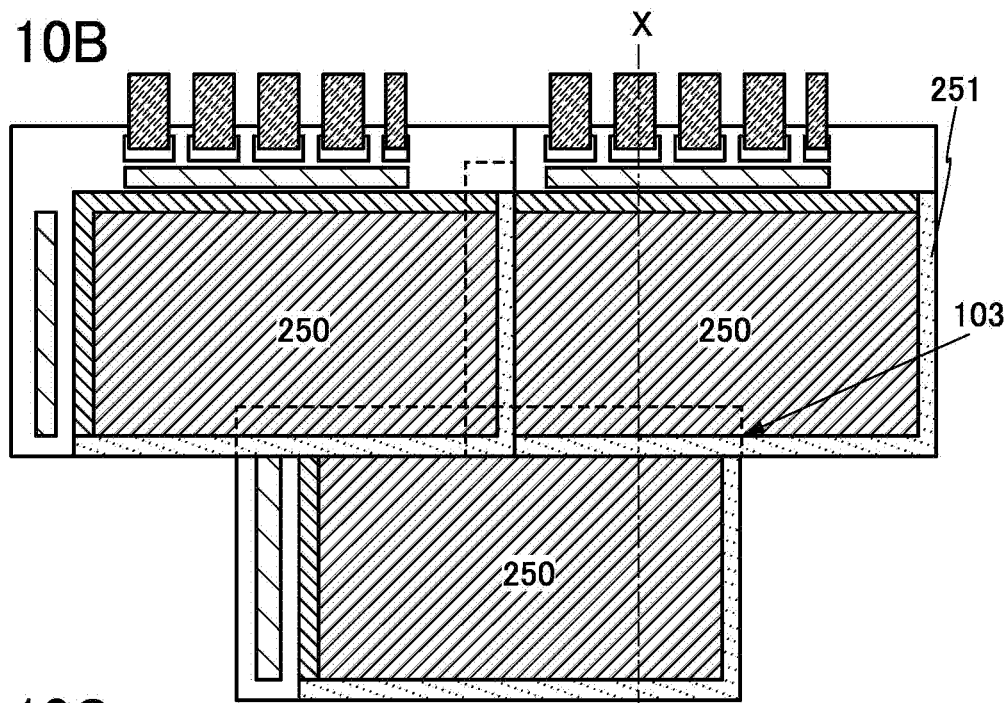
Figure 10C:
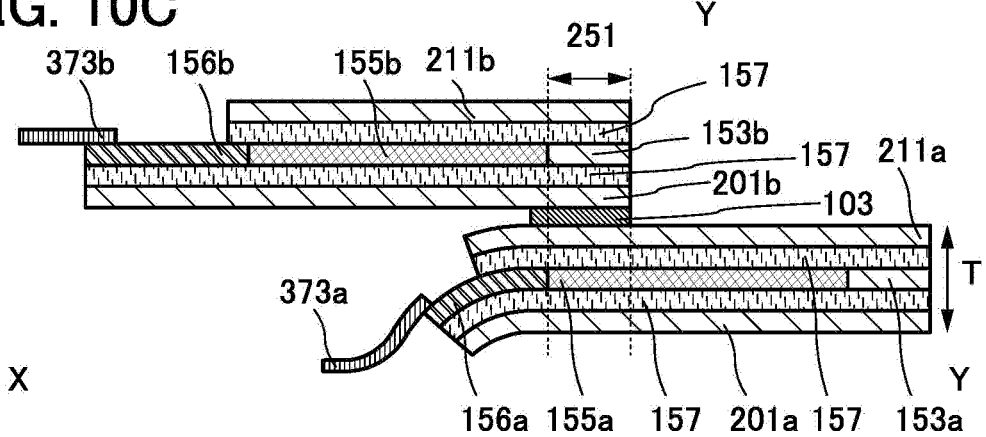

FIG. 10(B) illustrates a schematic view of a display device in which three display panels overlap with one another to have a T-shape. FIG. 10(C) illustrates a cross-sectional schematic view taken along a dashed dotted line X-Y of the display device of FIG. 10(B).

The display device in this example is formed by overlapping a plurality of display panels so that a non-display region between display regions becomes small. Specifically, the light-transmitting layer 103 is provided between the visible-light-transmitting region 251 of an upper display panel and the light-emitting portion 250 of a lower display panel.

From an end portion of the light-emitting portion 250 to an end portion of the display panel along two sides of the display panel, a component that blocks visible light such as a lead wiring or a driver is not provided and the region along two sides serves as the visible-light-transmitting region 251. The width of the visible-light-transmitting region 251 of the display panel was approximately 5 mm. The thickness T of the visible-light-transmitting region 251 (also referred to as a thickness of one display panel) is approximately 110 µm, which is very small. Therefore, although the display device in this example has a portion in which at most three display panels overlap with one another, a step generated on the display surface side is extremely small; thus, a seam is less likely to be noticed.

The three display panels have flexibility. For example, as illustrated in FIG. 10(C), a region near an FPC 373a of the lower display panel can be curved so that part of the lower display panel and part of the FPC 373a can be placed under the light-emitting portion 250 of the upper display panel adjacent to the FPC 373a. As a result, the FPC 373a can be placed without physical interference with the rear surface of the upper display panel. In this way, another display panel can be provided on four sides of the display panel, whereby a large-sized display device is easily achieved.

In this example, an adsorption film including adsorption layers on both surfaces of a base material was used as the light-transmitting layer 103. With the use of the adsorption film, two display panels included in the display device can be detachably attached to each other. An adsorption layer on one side of the light-transmitting layer 103 is adsorbed onto a substrate 211a, and an adsorption layer on the other side of the light-transmitting layer 103 is adsorbed onto a substrate 201b.

In FIG. 10(B), the light-transmitting layer 103 includes not only a portion overlapping with the visible-light-transmitting region 251 but also a portion overlapping with the light-emitting portion 250. In FIG. 10(C), the light-transmitting layer 103 overlaps with the entire visible-light-transmitting region 251 from an end portion of the substrate 201b, and also overlaps with part of a region 155b including a display element. Note that the light-transmitting layer 103 is not provided on a curved portion of the display panel near a portion to which the FPC 373a is connected in FIG. 10(C). However, the light-transmitting layer 103 may be provided depending on the thickness of the light-transmitting layer 103 or the thickness of a flexible substrate.

Each of the display panels was formed by attaching a substrate and an element layer with a bonding layer. For example, as illustrated in FIG. 10(C), a substrate 201a, the substrate 211a, the substrate 201b, and a substrate 211b are attached to an element layer 153a, the element layer 153a, an element layer 153b, and the element layer 153b, respectively, with a bonding layer 157. The element layer 153a has a region 155a including a display element and a region 156a including a wiring electrically connected to the display element. Similarly, the element layer 153b has the region 155b including a display element and a region 156b including a wiring electrically connected to the display element.

Figure 11:
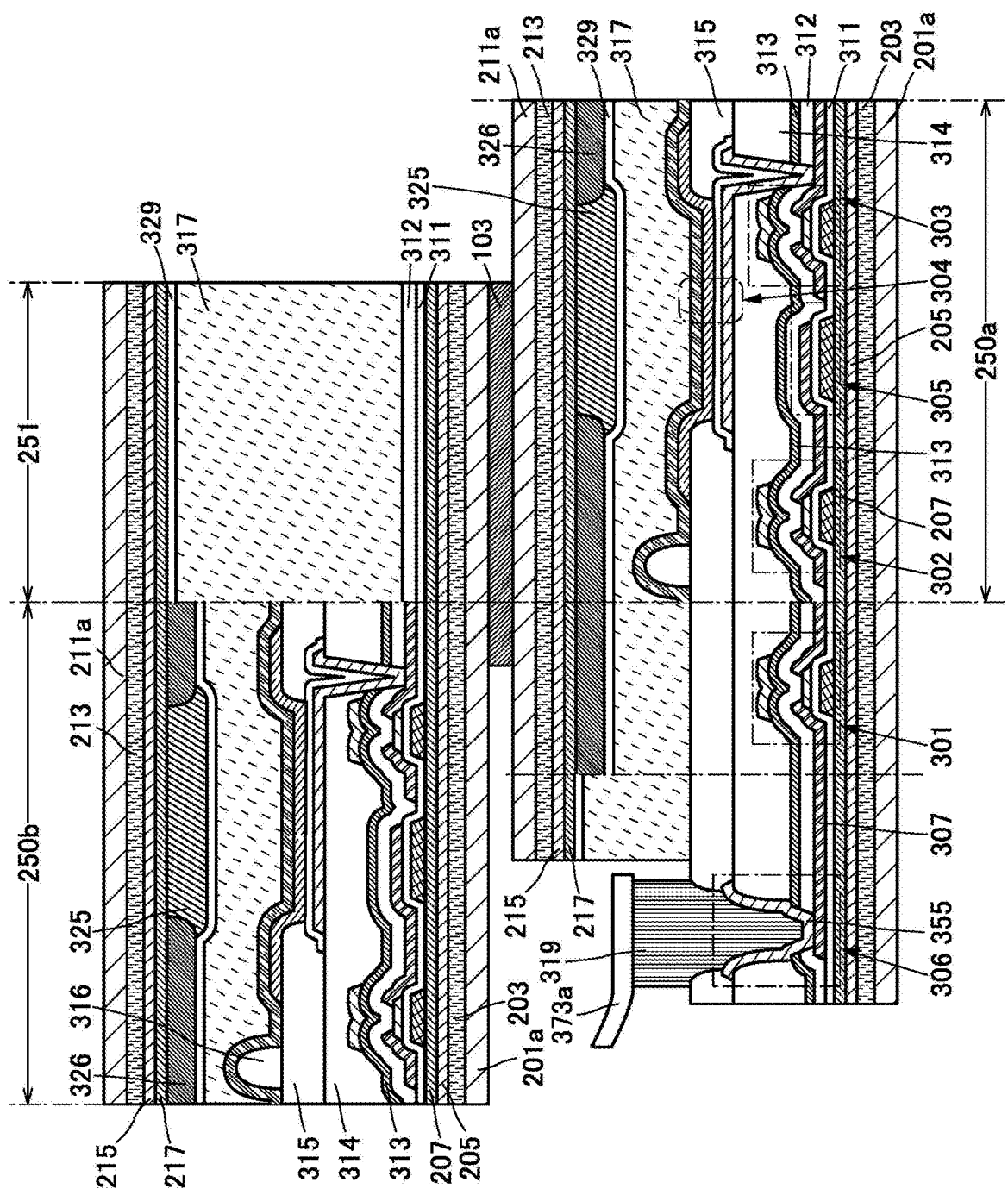
FIG. 11 A cross-sectional view illustrating a display device of Example 1.

FIG. 11 illustrates a cross-sectional view of a display device including an overlapping portion of two display panels.

The structures of the light-emitting portion 250 and the visible-light-transmitting region 251 of the display panels used in this example will be described with reference to FIG. 11. The structures of a light-emitting portion 250a and a light-emitting portion 250b are similar to each other, and thus they are collectively described as the light-emitting portion 250. The light-emitting portion 250 and the visible-light-transmitting region 251 include the first insulating layer 205, the second insulating layer 207, the gate insulating layer 311, the insulating layer 312, the third insulating layer 215, and the fourth insulating layer 217. The insulating layer 313, the insulating layer 314, and the insulating layer 315 are provided in the light-emitting portion 250 and not provided in the visible-light-transmitting region 251. The display panel in this example has a structure similar to that of the display panel 370A in FIG. 9(A) described in Embodiment 4 other than the structure of the visible-light-transmitting region 251.

Figure 12A:
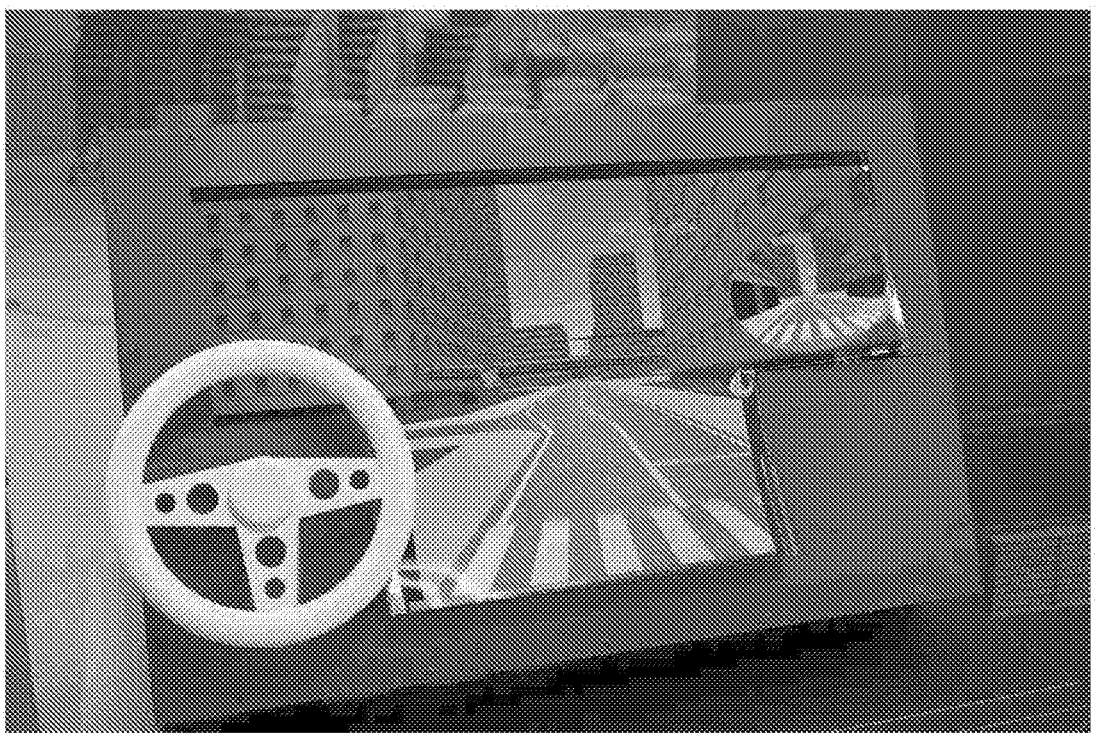
FIGS. 12A-12B Photographs of a display device.
Figure 12B:
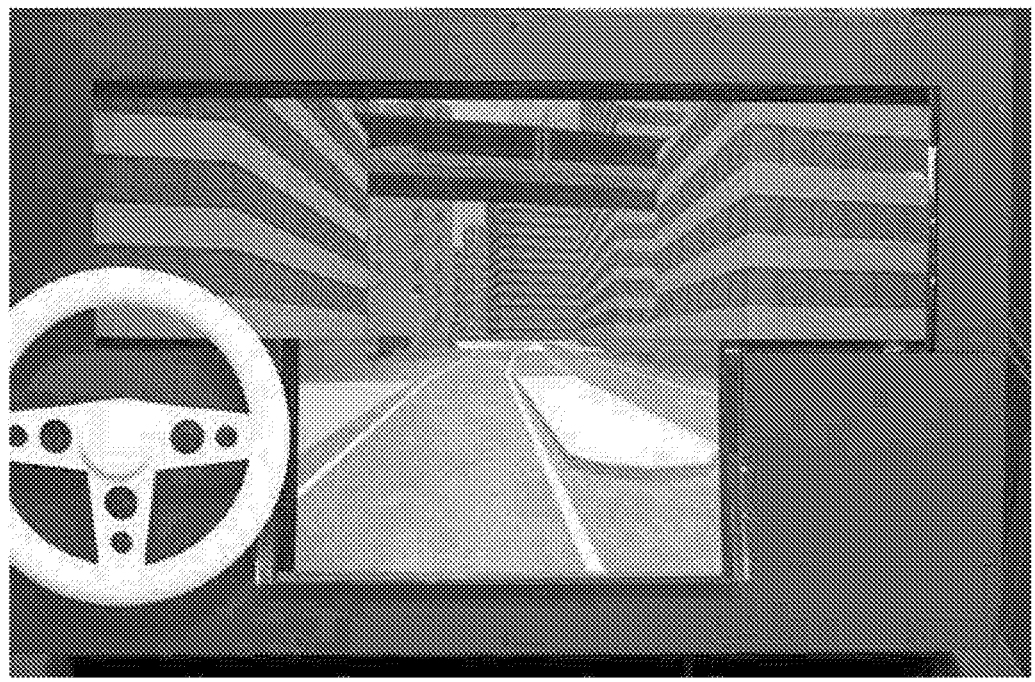

FIG. 12(A) is a photograph of the actually fabricated panel. FIG. 12(A) illustrates a state where an end portion of the display panel on the right side is pushed out by a position adjustment function from the rear side of the display panel to be curved and the video of the rear portion (the side mirror video) is displayed on the circular region. The video displayed in FIG. 12(A) is image video, and video shot by a camera (the side mirror video) is displayed on the circular region in the case where the panel is actually mounted on a car. Naturally, the curved portion can be undone by the position adjustment function. FIG. 12(B) is a photograph of the undone panel. Note that the video displayed in the display device of FIG. 12(B) displays car navigation video.

Figure 13:
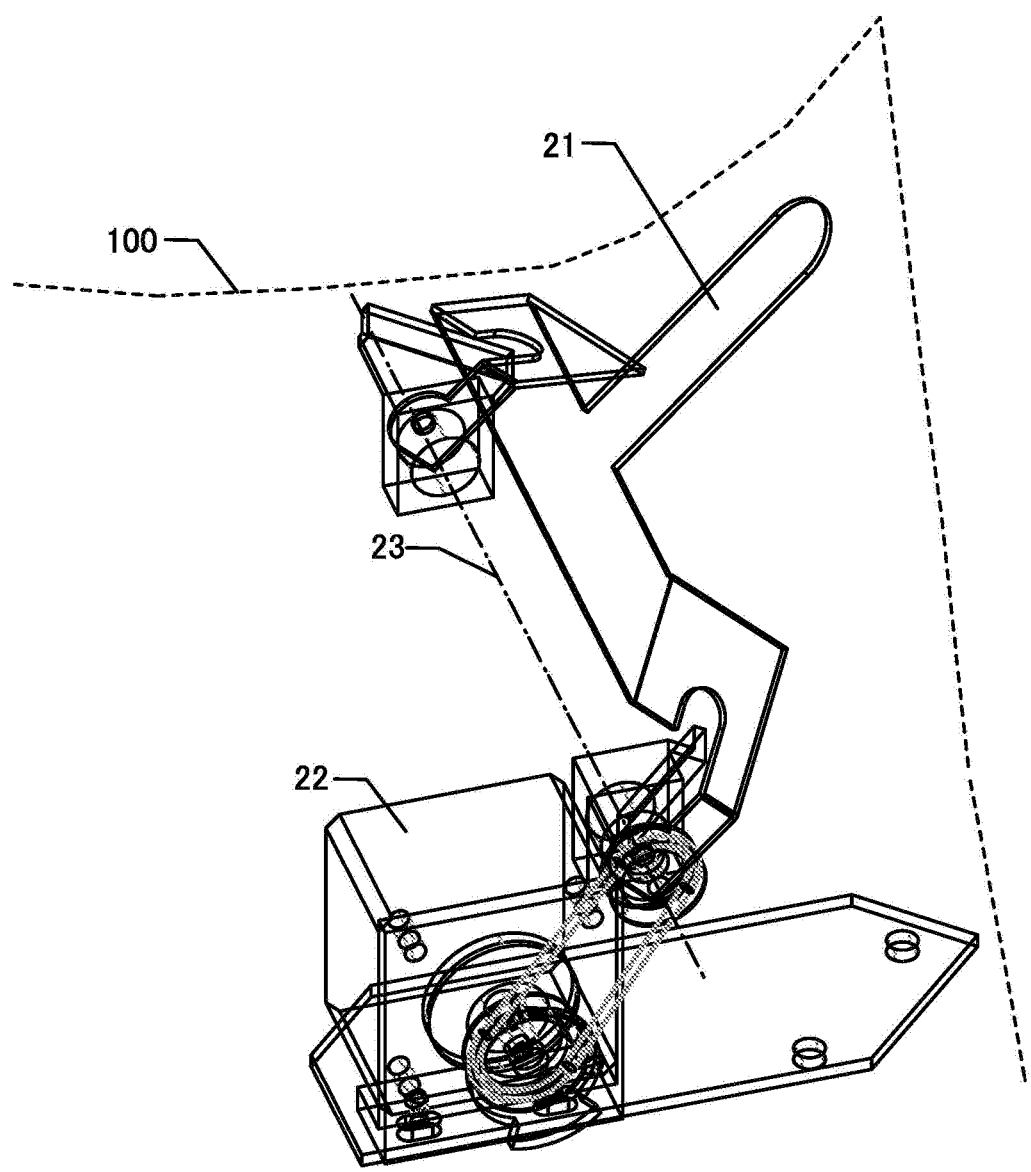
FIG. 13 A diagram illustrating a perspective view of a position adjustment jig.

FIG. 13 illustrates an example of a position adjustment jig 21 that pushes out part of the display panel on the right side. FIG. 13 illustrates a state where the periphery of the display panel 100 is pushed out to be in a position indicated by a dotted line. One end of the display panel is moved in such a manner that the position adjustment jig 21 is moved by rotating a rotation axis 23 indicated by a chain line by a motor 22. A region with a radius of about 14.5 cm with one end of the display panel as its center is pushed up, and the one end of the display panel that is pushed up is lifted up to about 5 cm from the flat plane of the display panel.

Figure 14A:
FIGS. 14A-14B Photographs of a display device.
Figure 14B:
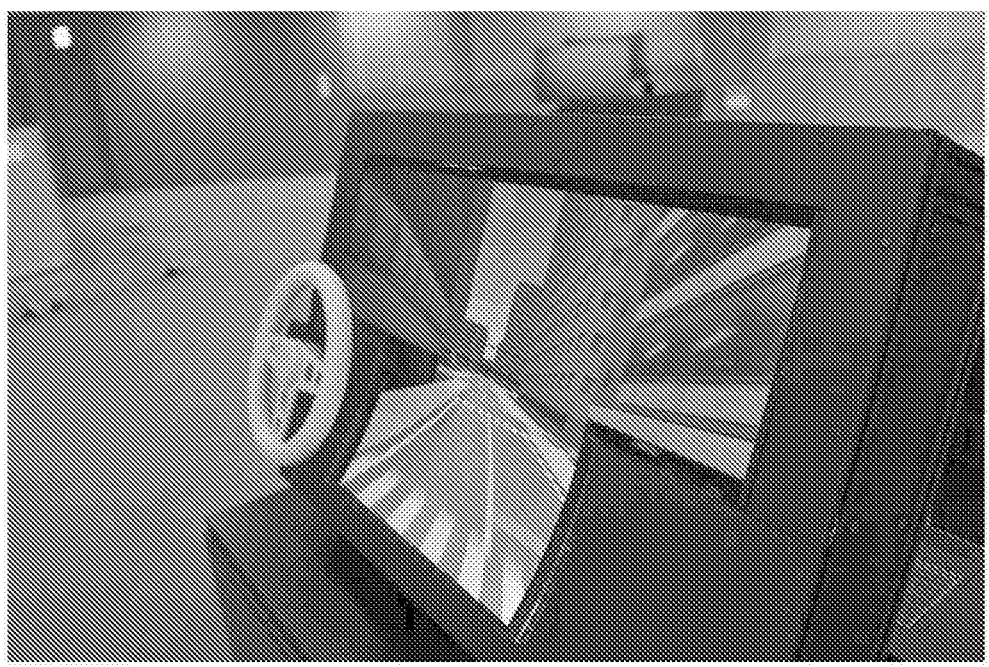

FIG. 14(A) shows a photograph taken from the side of the display panel in a partly pushed state. FIG. 14(B) shows a photograph taken from the side in a state where the position adjustment jig 21 is undone. As illustrated in FIG. 14(B), the side mirror video is displayed on a circular region. Note that the display images are all image data.

REFERENCE NUMERALS 10 display device
11 display device 12 display device
13 display device
21 position adjustment jig
22 motor
23 rotation axis
100 display panel
101 display region
103 light-transmitting layer
110 region
112 FPC
120 region
132 protective substrate
153a element layer
153b element layer
155a region
155b region
156a region
156b region
157 bonding layer
161 portion
162 portion
163 portion
165 portion
166 optical member
167 position adjustment unit
168 portion
201 substrate
201a substrate
201b substrate
203 bonding layer
205 insulating layer
207 insulating layer
209 element layer
211 substrate
211a substrate
211b substrate
213 bonding layer
215 insulating layer
217 insulating layer
221 bonding layer
223 connection terminal
231 formation substrate
233 separation layer
250 light-emitting portion
250a light-emitting portion
250b light-emitting portion
251 region
255 scan driver
257 wiring
301 transistor
302 transistor
303 transistor
304 light-emitting element
305 capacitor
306 connection portion
307 conductive layer
311 gate insulating layer
312 insulating layer
313 insulating layer
314 insulating layer
315 insulating layer
316 spacer
317 bonding layer
319 connector
321 electrode
322 EL layer
323 electrode
324 optical adjustment layer
325 coloring layer
326 light-blocking layer
329 overcoat
355 conductive layer
370 display panel
370A display panel
370B display panel
373 FPC
373a FPC
381 display portion
382 driver circuit portion
5001 dashboard
5002 display device
5002a display region
5002b display region
5002c display region
5002d display region
5002e left-edge portion
5003 handle
5004 windshield
5005 camera
5006 ventilation duct

What is claimed is:

1. A display device comprising:
a first display panel comprising a first region and a second region;
a second display panel comprising a third region and a fourth region; and
a third display panel comprising a fifth region and a sixth region,
wherein the first region, the third region, and the fifth region are each configured to transmit visible light,
wherein the second region, the fourth region, and the sixth region are each configured to perform display,
wherein the display device comprises a first portion, where the first region and the fourth region overlap each other,
wherein the display device comprises a second portion, where the fifth region and the second region overlap each other,
wherein the display device comprises a third portion, where the fifth region and the fourth region overlap each other,
wherein the display device comprises a display region comprising the second region, the fourth region, and the sixth region,
wherein the display region has a T-shape,
wherein the display device comprises a fourth portion, where the fifth region, the fourth region, and the first region overlap one another,
wherein the display device comprises a fifth portion, where the second region, the third region, and the fifth region overlap one another,
wherein the fourth portion and the fifth portion are provided between the second portion and the third portion, and
wherein at least one of the first display panel, the second display panel, and the third display panel is flexible and comprises an adjustment function of curving an end portion.

2. The display device according to claim 1, further comprising a first terminal portion on a long side of the first display panel.

3. The display device according to claim 1, wherein a display area of the first display panel and a display area of the second display panel are the same.

4. The display device according to claim 1, wherein at least one of the first display panel, the second display panel, and the third display panel comprises an organic light-emitting element.

5. The display device according to claim 1, further comprising an optical member over the first display panel, the second display panel, and the third display panel.

6. A display device comprising:
- a first display panel comprising a first region and a second region;
- a second display panel comprising a third region and a fourth region; and
- a third display panel comprising a fifth region and a sixth region,
- wherein the first region, the third region, and the fifth region are each configured to transmit visible light,
- wherein the second region, the fourth region, and the sixth region are each configured to perform display,
- wherein the display device comprises a first portion where the first region and the fourth region overlap each other,
- wherein the display device comprises a second portion where the fifth region and the second region overlap each other,
- wherein the display device comprises a third portion where the fifth region and the fourth region overlap each other,
- wherein the display device comprises a display region comprising the second region, the fourth region, and the sixth region,
- wherein the display region has a T-shape,
- wherein the display device comprises a fourth portion where the fifth region, the fourth region, and the first region overlap one another,
- wherein the display device comprises a fifth portion where the second region, the third region, and the fifth region overlap one another,
- wherein the fourth portion and the fifth portion are provided between the second portion and the third portion,
- wherein the first display panel comprises a first terminal portion on a long side of the first display panel,
- wherein the second display panel comprises a second terminal portion on a long side of the second display panel,
- wherein the third display panel comprises a third terminal portion on a long side of the third display panel, and
- wherein the third terminal portion is provided in the second portion and the third portion.

7. The display device according to claim 6, wherein at least one of the first display panel, the second display panel, and the third display panel is flexible and comprises an adjustment function of curving an end portion.

8. The display device according to claim 6, wherein a display area of the first display panel and a display area of the second display panel are the same.

9. The display device according to claim 6, wherein at least one of the first display panel, the second display panel, and the third display panel comprises an organic light-emitting element.

10. The display device according to claim 6, further comprising an optical member over the first display panel, the second display panel, and the third display panel.

11. A vehicle comprising a display device placed in a dashboard, the display device comprising:
- a first display panel comprising a first region and a second region;
- a second display panel comprising a third region and a fourth region; and
- a third display panel comprising a fifth region and a sixth region,
- wherein the first region, the third region, and the fifth region are each configured to transmit visible light,
- wherein the second region, the fourth region, and the sixth region are each configured to perform display,
- wherein the display device comprises a first portion where the first region and the fourth region overlap each other,
- wherein the display device comprises a second portion where the fifth region and the second region overlap each other,
- wherein the display device comprises a third portion where the fifth region and the fourth region overlap each other,
- wherein the display device comprises a display region comprising the second region, the fourth region, and the sixth region,
- wherein the display region has a T-shape,
- wherein the display device comprises a fourth portion where the fifth region, the fourth region, and the first region overlap one another,
- wherein the display device comprises a fifth portion where the second region, the third region, and the fifth region overlap one another,
- wherein the fourth portion and the fifth portion are provided between the second portion and the third portion,
- wherein the first display panel comprises a first terminal portion on a long side of the first display panel,
- wherein the second display panel comprises a second terminal portion on a long side of the second display panel,
- wherein the third display panel comprises a third terminal portion on a long side of the third display panel, and
- wherein the third terminal portion is provided in the second portion and the third portion.

12. The vehicle according to claim 11, wherein at least one of the first display panel, the second display panel, and the third display panel is flexible and comprises an adjustment function of curving an end portion.

13. The vehicle according to claim 11, wherein a display area of the first display panel and a display area of the second display panel are the same.

14. The vehicle according to claim 11, wherein at least one of the first display panel, the second display panel, and the third display panel comprises an organic light-emitting element.

15. The vehicle according to claim 11, further comprising an optical member over the first display panel, the second display panel, and the third display panel.

* * * * *